United States Patent
Honda et al.

(10) Patent No.: US 12,091,542 B2
(45) Date of Patent: Sep. 17, 2024

(54) RESIN COMPOSITION, PREPREG, METAL FOIL-CLAD LAMINATE, RESIN SHEET, AND PRINTED WIRING BOARD

(71) Applicant: Mitsubishi Gas Chemical Company, Inc., Tokyo (JP)

(72) Inventors: Saori Honda, Tokyo (JP); Katsuya Yamamoto, Tokyo (JP); Kazuyuki Higashita, Tokyo (JP); Yoshitaka Ueno, Fukushima (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 678 days.

(21) Appl. No.: 17/059,655

(22) PCT Filed: May 31, 2019

(86) PCT No.: PCT/JP2019/021694
§ 371 (c)(1),
(2) Date: Nov. 30, 2020

(87) PCT Pub. No.: WO2019/230945
PCT Pub. Date: Dec. 5, 2019

(65) Prior Publication Data
US 2021/0214547 A1 Jul. 15, 2021

(30) Foreign Application Priority Data

Jun. 1, 2018 (JP) .................................. 2018-105997
Aug. 8, 2018 (JP) .................................. 2018-149063

(51) Int. Cl.
*C08L 53/02* (2006.01)
*B32B 5/02* (2006.01)
*B32B 15/08* (2006.01)
*B32B 15/14* (2006.01)
*B32B 15/20* (2006.01)
*C08J 5/24* (2006.01)
*C08L 71/12* (2006.01)
*C09D 153/02* (2006.01)
(Continued)

(52) U.S. Cl.
CPC .............. *C08L 53/02* (2013.01); *B32B 5/024* (2013.01); *B32B 15/08* (2013.01); *B32B 15/14* (2013.01); *B32B 15/20* (2013.01); *C08J 5/24* (2013.01); *C08L 71/123* (2013.01); *C08L 71/126* (2013.01); *C09D 153/02* (2013.01); *C09D 171/12* (2013.01); *H05K 1/0346* (2013.01); *H05K 1/0373* (2013.01); *B32B 2260/046* (2013.01); *B32B 2262/101* (2013.01); *B32B 2264/1021* (2020.08); *B32B 2307/204* (2013.01); *B32B 2307/3065* (2013.01); *B32B 2457/08* (2013.01); *C08J 2325/10* (2013.01); *C08J 2353/02* (2013.01); *C08J 2371/12* (2013.01); *C08J 2425/10* (2013.01); *C08J 2453/02* (2013.01); *C08J 2471/12* (2013.01); *C08L 2205/025* (2013.01)

(58) Field of Classification Search
CPC ........ C08K 5/315; C08K 5/3415; C08K 3/36; C08L 71/126; C08L 71/12; C08L 71/12; C08L 71/123; C08L 25/16; C08L 53/02; C08L 53/025
See application file for complete search history.

(56) References Cited

U.S. PATENT DOCUMENTS 4,904,760 A * 2/1990 Gaku ..................... C08G 73/12
528/211
9,402,310 B2 7/2016 Wang et al.
(Continued)

FOREIGN PATENT DOCUMENTS

CN 101508844 A 8/2009
CN 103965606 A 8/2014
(Continued)

OTHER PUBLICATIONS

Office Action issued in corresponding Taiwanese Patent Application No. 108118867 dated Dec. 23, 2022.
(Continued)

*Primary Examiner* — Monique R Jackson
(74) *Attorney, Agent, or Firm* — Morgan, Lewis & Bockius LLP

(57) ABSTRACT

A resin composition contains a maleimide compound (A), a cyanate ester compound (B), a polyphenylene ether compound (C) with a number average molecular weight of not lower than 1000 and not higher than 7000 and represented by Formula (1), and a block copolymer (D) having a styrene backbone. In Formula (1), X represents an aryl group; —(Y—O)$n_2$- represents a polyphenylene ether moiety; $R_1$, $R_2$, and $R_3$ each independently represent a hydrogen atom, an alkyl group, an alkenyl group, or an alkynyl group; $n_2$ represents an integer of from 1 to 100; $n_1$ represents an integer of from 1 to 6; and $n_3$ represents an integer of from 1 to 4.

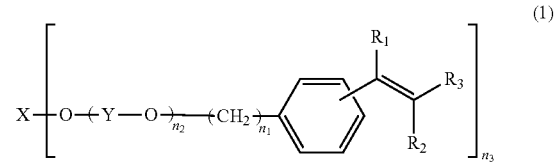

17 Claims, No Drawings

(51) Int. Cl.
*C09D 171/12* (2006.01)
*H05K 1/03* (2006.01)

(56) References Cited

U.S. PATENT DOCUMENTS

| | | | |
|---|---|---|---|
| 2006/0074151 A1* | 4/2006 | He | C08L 63/00 523/457 |
| 2007/0077413 A1* | 4/2007 | Amou | B32B 5/26 428/323 |
| 2007/0129502 A1* | 6/2007 | Kawabe | C08L 53/00 525/391 |
| 2008/0300350 A1 | 12/2008 | Ohno et al. | |
| 2009/0203279 A1 | 8/2009 | Mori et al. | |
| 2014/0235126 A1 | 8/2014 | Mori et al. | |
| 2014/0349090 A1 | 11/2014 | Hsieh | |
| 2015/0044485 A1 | 2/2015 | Wang et al. | |
| 2015/0166788 A1* | 6/2015 | Li | C08L 71/00 524/508 |
| 2015/0259489 A1* | 9/2015 | Umehara | H05K 1/0353 428/221 |
| 2021/0032424 A1* | 2/2021 | Umehara | C08G 73/126 |
| 2021/0061996 A1* | 3/2021 | Umehara | C08J 5/244 |

FOREIGN PATENT DOCUMENTS

| | | |
|---|---|---|
| CN | 104177809 A | 12/2014 |
| CN | 104341766 A | 2/2015 |
| JP | 2003-138132 A | 5/2003 |
| JP | 2009-161725 A | 7/2009 |
| JP | 2010-138364 A | 6/2010 |
| JP | 2010-275527 A | 12/2010 |
| JP | 2011-208150 A | 10/2011 |
| JP | 5233710 B2 | 7/2013 |
| JP | 5649773 B2 | 1/2015 |
| JP | 2017-206578 A | 11/2017 |
| JP | 2018-062568 A | 4/2018 |
| JP | 2018-131519 A | 8/2018 |

OTHER PUBLICATIONS

Extended European Search Report issued in the corresponding European Patent Application No. 19810843.3 dated Mar. 4, 2022.
Office Action issued in the corresponding Chinese Patent Application No. 201980035966.X Sep. 26, 2022.
International Search Report issued in corresponding International Patent Application No. PCT/JP2019/021694 dated Jul. 9, 2019.
International Preliminary Report on Patentability and Written Opinion issued in corresponding International Patent Application No. PCT/JP2019/021694 dated Dec. 10, 2020.

\* cited by examiner

RESIN COMPOSITION, PREPREG, METAL FOIL-CLAD LAMINATE, RESIN SHEET, AND PRINTED WIRING BOARD

TECHNICAL FIELD

The present invention relates to a resin composition, a prepreg produced using the resin composition, a metal foil-clad laminate and a resin sheet produced using the resin composition or the prepreg, and a printed wiring board produced using these.

BACKGROUND ART

In recent years, higher integration and miniaturization of semiconductors used in electronic devices, communication devices, personal computers, or the like have increasingly accelerated. Along with this trend, various properties required for laminates for semiconductor packages (e.g., such as metal foil-clad laminates) used in printed wiring boards have been increasingly demanding. Examples of the required properties include low dielectric constant properties, low dielectric loss tangent properties, low thermal expansivity, copper foil peel strength, low water absorbability, and heat resistance. Among others, insulating materials with large dielectric constant and large dielectric loss tangent have attenuated electric signals and impaired reliability, and thus materials with small dielectric constant and small dielectric loss tangent are required. Furthermore, a problem of expansion of warpage occurs in multilayer printed wiring boards, and thus low thermal expansivity of insulator materials has also become important.

To obtain printed wiring boards with improved properties, researches have been conducted on resin compositions used as materials for printed wiring boards. For example, Patent Document 1 discloses a composition having excellent varnish storage stability and having improved electrical properties, copper foil peel strength, and thermal decomposition temperature without reducing multilayer moldability and heat resistance after moisture absorption, in which a bifunctional vinyl benzyl compound containing a specific polyphenylene ether backbone, a specific maleimide compound, a specific cyanate ester resin, and a specific epoxy resin are combined as components in predetermined proportions.

Patent Document 2 discloses a resin composition that can be cured at low temperatures and provide a cured product excellent in low dielectric properties, heat resistance, mechanical properties, and chemical resistance, in which a specific vinyl compound, a characteristic maleimide compound, and a styrene-based thermoplastic elastomer are combined as components in predetermined proportions.

Patent Document 3 discloses a thermosetting resin composition that can prevent a resin residue while providing a low dielectric loss tangent, in which a polyphenylene ether; at least one selected from the group consisting of a cyanate ester resin, a phenol resin, a maleimide compound, and an epoxy resin; and a filler are combined in predetermined proportions.

CITATION LIST

Patent Documents

Patent Document 1: JP 5233710 B
Patent Document 2: JP 5649773 B
Patent Document 3: JP 2017-206578 A

SUMMARY OF INVENTION

Technical Problem

Examples of Patent Document 1 disclose that a resin composition containing a bifunctional vinyl benzyl compound containing a specific polyphenylene ether backbone, a specific maleimide compound, a specific cyanate ester resin, and a specific epoxy resin, when used in a copper-clad laminate, improves low dielectric loss tangent properties, metal foil (copper foil) peel strength, and moisture absorption heat resistance.

On the other hand, Examples of Patent Document 2 describe examples of films produced using resin compositions containing a specific vinyl compound, a characteristic maleimide compound, and a styrene-based thermoplastic elastomer, combined in predetermined proportions, and the low thermal expansivity and low dielectric loss tangent properties were evaluated for the films.

In addition, Examples of Patent Document 3 disclose that the combination of specific components with a polyphenylene ether and the control of the content of the polyphenylene ether can prevent a resin residue while providing low dielectric loss tangent properties. However, specific evaluation results cannot be confirmed for low thermal expansivity. Furthermore, use of a polybutadiene modified with a hydroxy group or an acrylic group is contemplated as an elastomer that provides further low dielectric loss tangent properties.

An object of the present invention is to provide a resin composition that, when used in materials for printed wiring boards (e.g., laminates or metal foil-clad laminates) or the like, simultaneously achieves excellent low dielectric constant properties, low dielectric loss tangent properties, and low thermal expansivity, and forms a uniform cured product; and a prepreg, a metal foil-clad laminate, a resin sheet, and a printed wiring board.

Solution to Problem

As a result of diligent research on the above problems, the present inventors found that a resin composition obtained by combining a maleimide compound (A), a cyanate ester compound (B), a specific polyphenylene ether compound (C), and a block copolymer (D) having a styrene backbone, when used in materials for printed wiring boards (e.g., laminates or metal foil-clad laminates) or the like, simultaneously achieves excellent low dielectric constant properties, low dielectric loss tangent properties, and low thermal expansivity, and forms a uniform cured product, and completed the present invention.

That is, the present invention is as follows.

(1)

A resin composition comprising a maleimide compound (A), a cyanate ester compound (B), a polyphenylene ether compound (C) with a number average molecular weight of not lower than 1000 and not higher than 7000, and a block copolymer (D) having a styrene backbone, wherein the polyphenylene ether compound (C) is represented by Formula (1) below:

[Chem. 1]

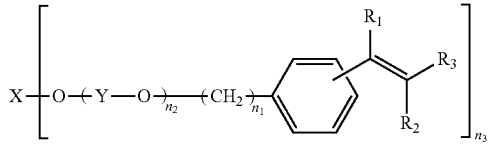

(1)

in Formula (1), X represents an aryl group; —(Y—O)$n_2$- represents a polyphenylene ether moiety; $R_1$, $R_2$, and $R_3$ each independently represent a hydrogen atom, an alkyl group, an alkenyl group, or an alkynyl group; $n_2$ represents an integer of 1 to 100; $n_1$ represents an integer of from 1 to 6; and $n_3$ represents an integer of from 1 to 4.

(2)

The resin composition according to (1), wherein the block copolymer (D) having a styrene backbone contains at least one selected from the group consisting of a styrene-butadiene block copolymer, a styrene-isoprene block copolymer, a styrene-hydrogenated butadiene block copolymer, a styrene-hydrogenated isoprene block copolymer, and a styrene-hydrogenated (isoprene/butadiene) block copolymer.

(3)

The resin composition according to (1) or (2), wherein the maleimide compound (A) contains at least one selected from the group consisting of Formulas (2), (3), (4), and (17) below:

[Chem. 2]

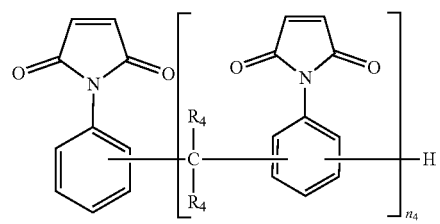

(2)

in Formula (2), $R_4$'s each independently represent a hydrogen atom or a methyl group; and $n_4$ represents an integer of not less than 1;

[Chem. 3]

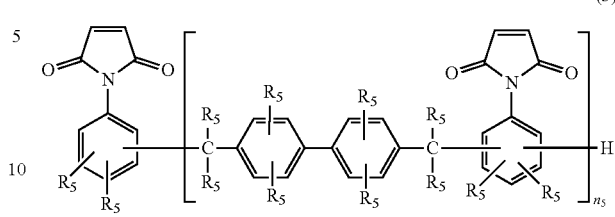

(3)

in Formula (3) above, $R_5$'s each independently represent a hydrogen atom, an alkyl group having from 1 to 8 carbon atoms, or a phenyl group; and $n_5$ represents an integer of not less than 1 and not more than 10;

[Chem. 4]

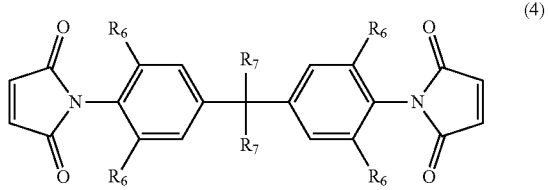

(4)

in Formula (4) above, $R_6$'s each independently represent a hydrogen atom, a methyl group, or an ethyl group; and $R_7$'s each independently represent a hydrogen atom or a methyl group; and

[Chem. 5]

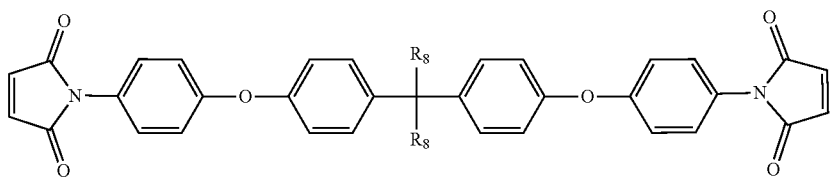

(17)

in Formula (17) above, $R_8$'s each independently represent a hydrogen atom, a methyl group, or an ethyl group.

(4)

The resin composition according to any one of (1) to (3), further comprising a styrene oligomer (E).

(5)

The resin composition according to any one of (1) to (4), further comprising a filler (F).

(6)

The resin composition according to (5), wherein a content of the filler (F) is from 50 to 300 parts by mass relative to 100 parts by mass of resin solid component.

(7)

The resin composition according to any one of (1) to (6), further comprising a flame retardant (G).

(8)

The resin composition according to any one of (1) to (7), wherein a content of the polyphenylene ether compound (C) represented by Formula (1) above is from 1 to 90 parts by mass relative to 100 parts by mass of resin solid component.

(9)

The resin composition according to any one of (1) to (8), wherein a content of the block copolymer (D) having a styrene backbone is from 1 to 50 parts by mass relative to 100 parts by mass of resin solid component.

(10)

The resin composition according to any one of (1) to (9), wherein the polyphenylene ether compound (C) represented by Formula (1) above is represented by Formula (11):

[Chem. 6]

$$\begin{array}{c}\text{(11)}\\ \text{styrene}-CH_2-[O-Y]_{n_2}-[O-X-O]-[Y-O]_{n_2}-CH_2-\text{styrene}\end{array}$$

in Formula (11), X is an aromatic group selected from groups represented by Formula (12), Formula (13), and Formula (14); each $-(Y-O)_{n_2}-$ independently represents a polyphenylene ether moiety; and each n2 independently represents an integer of from 1 to 100;

[Chem. 7]

(12)

[structure showing biphenyl with six CH$_3$ groups]

[Chem. 8]

(13)

[structure showing biphenyl with R$_{38}$, R$_{39}$, R$_{40}$, R$_{41}$, CH$_3$ groups and linker B]

in Formula (13), $R_{38}$, $R_{39}$, $R_{40}$, and $R_{41}$ each independently represent a hydrogen atom or a methyl group; and —B— is a linear, branched, or cyclic divalent hydrocarbon group having 20 or less carbon atoms.

[Chem. 9]

(14)

[structure showing two phenyl rings linked by B]

in Formula (14), —B— is a linear, branched, or cyclic divalent hydrocarbon group having 20 or less carbon atoms.

(11)

A prepreg formed from a substrate and a resin composition described in any one of (1) to (10).

(12)

A metal foil-clad laminate including one or more layered prepregs described in (11), and a metal foil disposed on one side or both sides of the layered prepregs.

(13)

A resin sheet including a support and a layer disposed on a surface of the support, the layer being formed from a resin composition described in any one of (1) to (10).

(14)

A printed wiring board including an insulating layer and a conductor layer disposed on a surface of the insulating layer, wherein the insulating layer includes a layer formed from a resin composition described in any one of (1) to (10).

Advantageous Effects of Invention

The resin composition of the present invention, when used in materials for printed wiring boards (e.g., laminates or metal foil-clad laminates) or: the like, can simultaneously achieve excellent low dielectric constant properties, low dielectric loss tangent properties, and low thermal expansivity, and form uniform cured products, such as a prepreg, a metal foil-clad laminate, a resin sheet, and a printed wiring board, and thus having a remarkably high industrial practicality.

DESCRIPTION OF EMBODIMENTS

Hereinafter, embodiments of the present invention (hereinafter, referred to as "the present embodiment") will be described. Note that the following embodiments are examples for describing the present invention, and the present invention is not limited only to the embodiments.

Resin Composition

A resin composition according to the present embodiment contains a maleimide compound (A), a cyanate ester compound (B), a polyphenylene ether compound (C) with a number average molecular weight of not lower than 1000 and not higher than 7000 and represented by Formula (1), and a block copolymer (D) having a styrene backbone. The resin composition according to the present embodiment includes the above constitution and thus, when used in materials for printed wiring boards (e.g., laminates or metal foil-clad laminates) or the like, simultaneously achieves excellent low dielectric constant properties, low dielectric loss tangent properties, and low thermal expansivity, and forms a uniform cured product.

Here, the uniform cured product means that no void or no poor dispersion is visible when the cross section of the cured product is observed with an optical microscope.

Maleimide Compound (A)

The maleimide compound (A) according to the present embodiment is not particularly limited and is any compound having one or more maleimide groups in the molecule. Specific examples of the maleimide compound (A) include N-phenylmaleimide, N-hydroxyphenylmaleimide, bis(4-maleimidophenyl)methane, 4,4'-diphenylmethane bismaleimide, bis(3,5-dimethyl-4-maleimidophenyl)methane, bis(3,5-diethyl-4-maleimidophenyl)methane, phenylmethane maleimide, o-phenylene bismaleimide, m-phenylene bismaleimide, p-phenylene bismaleimide, o-phenylene biscitraconimide, m-phenylene biscitraconimide, p-phenylene biscitraconimide, 2,2-bis(4-(4-maleimidophenoxy)-phenyl)propane, 3,3'-diethyl-5,5'-dimethyl-4,4'-diphenylmethane bismaleimide, 4-methyl-1,3-phenylene bismaleimide, 1,6-bismaleimide-(2,2,4-trimethyl)hexane, 4,4'-diphenylether bismaleimide, 4,4'-diphenylsulfone bismaleimide, 1,3-bis(3-maleimidophenoxy)benzene, 1,3-bis(4-maleimidophenoxy)benzene, 4,4'-diphenylmethane biscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, and maleimide compounds represented by Formulas (2), (3), (4), and (17) above.

Among them, the maleimide compounds represented by Formulas (2), (3), (4), and (17) above are particularly preferred in terms of improving low thermal expansivity and heat resistance. These maleimide compounds may be used alone, or two or more may be used in combination.

In Formula (2) above, $R_4$'s each independently represent a hydrogen atom or a methyl group and is preferably a hydrogen atom. In addition, in Formula (2), $n_4$ represents an integer of not less than 1, and the upper limit of $n_4$ is typically 10, and in terms of solubility in an organic solvent, the upper limit of $n_4$ is preferably 7 and more preferably 5. The maleimide compound (A) may contain two or more compounds differing in $n_4$.

In Formula (3) above, $R_5$'s each independently represent a hydrogen atom, an alkyl group having from 1 to 8 carbon atoms (e.g., such as a methyl group, an ethyl group, an n-propyl group, an isopropyl group, an n-butyl group, an isobutyl group, a t-butyl group, or an n-pentyl group), or a phenyl group. Among them, in terms of improving flame resistance and metal foil (copper foil) peel strength, the $R_5$ is preferably a group selected from the group consisting of a hydrogen atom, a methyl group, and a phenyl group, more preferably one of a hydrogen atom and a methyl group, and even more preferably a hydrogen atom.

In Formula (3), $1 \leq n_5 \leq 10$. In terms of even better solubility in solvents, $n_5$ is preferably not more than 4, more preferably not more than 3, and even more preferably not more than 2. The maleimide compound (A) may contain two or more compounds differing in $n_5$.

In Formula (4), $R_6$'s each independently represent a hydrogen atom, a methyl group, or an ethyl group, and $R_7$'s each independently represent a hydrogen atom or a methyl group. In terms of even better low dielectric constant properties and low dielectric loss tangent properties, $R_6$ is preferably a methyl group or an ethyl group. Examples of such compounds include 3,3'-diethyl-5,5'-dimethyl-4,4'-diphenylmethane bismaleimide.

In Formula (17) above, $R_8$'s each independently represent a hydrogen atom, a methyl group, or an ethyl group. In terms of even better low dielectric constant properties and low dielectric loss tangent properties, $R_8$ is preferably a methyl group. Examples of such compounds include 2,2-bis(4-(4-maleimidophenoxy)-phenyl)propane.

As the maleimide compound (A) used in the present embodiment, commercially available products may be used. For example, "BMI-2300" available from Daiwa Kasei Industry Co., Ltd. as the maleimide compound represented by Formula (2), "MIR-3000" available from Nippon Kayaku Co., Ltd. as the maleimide compound represented by Formula (3), "BMI-70" available from K-I Chemical Industry Co., Ltd. as the maleimide compound represented by Formula (4), and "BMI-80" available from K-I Chemical Industry Co., Ltd. as the maleimide compound represented by Formula (17) can be suitably used.

The content of the maleimide compound (A) in the resin composition according to the present embodiment can be set appropriately according to the desired properties and is not particularly limited. The content of the maleimide compound (A) is preferably not less than 1 part by mass and more preferably not less than 5 parts by mass when resin solid component in the resin composition are 100 parts by mass. The upper limit of the content is preferably not more than 90 parts by mass, more preferably not more than 60 parts by mass, even more preferably not more than 40 parts by mass, and may be not more than 30 parts by mass. The resin composition with the content of the maleimide compound (A) in such a range tends to exhibit high heat resistance and low water absorbability more effectively.

Only one maleimide compound (A) may be used, or two or more may be used. When two or more maleimide compounds (A) are used, their total amount is preferably in the above range.

Here, unless otherwise noted, the "resin solid component in the resin composition" refers to components in the resin composition excluding a solvent and a filler (F), and 100 parts by mass of resin solid component refers to that a total amount of components excluding a solvent and the filler (F) in the resin composition is 100 parts by mass.

Cyanate Ester Compound (B)

The cyanate ester compound (B) according to the present embodiment is any resin having an aromatic moiety in the molecule, which has at least one cyanate group (cyanate ester group).

Examples of the cyanate ester compound (B) in the present embodiment include compounds represented by Formula (5):

[Chem. 10]

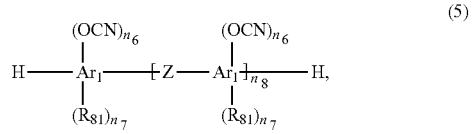

(5)

in Formula (5), each $Ar_1$ independently represents a phenylene group that may have a substituent, a naphthylene group that may have a substituent, or a biphenylene group that may have a substituent; each $R_{81}$ is independently selected from any one of a hydrogen atom, an alkyl group that has from 1 to 6 carbon atoms and may have a substituent, an aryl group that has from 6 to 12 carbon atoms and may have a substituent, an alkoxy group that has from 1 to 4 carbon atoms and may have a substituent, an aralkyl group in which an alkyl group having from 1 to 6 carbon atoms and an aryl group having from 6 to 12 carbon atoms are bonded and which may have a substituent, or an alkylaryl group in which an alkyl group having from 1 to 6 carbon atoms and an aryl group having from 6 to 12 carbon atoms are bonded and which may have a substituent; $n_6$ represents the number of the cyanate group bonded to $Ar_1$ and is an integer of 1 to 3; $n_7$ represents the number of $R_{81}$ bonded to $Ar_1$ and is 4-$n_6$ when $Ar_1$ is a phenylene group, 6-$n_6$ when $Ar_1$ is a naphthylene group, and 8-$n_6$ when $Ar_1$ is a biphenylene group; $n_8$ represents the average number of repetition and is an integer of from 0 to 50; the cyanate ester compound (B) may be a mixture of compounds differing in $n_8$; and each Z is independently selected from any one of a single bond, a divalent organic group having from 1 to 50 carbon atoms (a hydrogen atom may be substituted with a hetero atom), a divalent organic group having from 1 to 10 nitrogen atoms (such as —N—R—N—), a carbonyl group (—CO—), a carboxy group (—C(=O)O—), a carbonyl dioxide group (—OC(=O)O—), a sulfonyl group (—SO$_2$—), and a divalent sulfur atom, or a divalent oxygen atom.

The alkyl group in $R_{81}$ of Formula (5) may have a linear structure, a branched structure, or a ring structure (such as a cycloalkyl group). In addition, the hydrogen atom in the alkyl group and the aryl group in $R_{81}$ in Formula (5) may be substituted with a halogen atom, such as a fluorine atom or a chlorine atom; an alkoxy group, such as a methoxy group or a phenoxy group; a cyano group; or the like.

Specific examples of the alkyl group include a methyl group, an ethyl group, a propyl group, an isopropyl group, an n-butyl group, an isobutyl group, a tert-butyl group, an n-pentyl group, a 1-ethylpropyl group, a 2,2-dimethylpropyl group, a cyclopentyl group, a hexyl group, a cyclohexyl group, and a trifluoromethyl group.

Specific examples of the aryl group include a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group.

Specific examples of the alkoxy group include a methoxy group, an ethoxy group, a propoxy group, an isopropoxy group, an n-butoxy group, an isobutoxy group, and a tert-butoxy group.

Specific examples of the divalent organic group in Z of Formula (5) include a methylene group, an ethylene group, a trimethylene group, a cyclopentylene group, a cyclohexylene group, a trimethylcyclohexylene group, a biphenylylmethylene group, a dimethylmethylene-phenylene-dimethylmethylene group, a fluorendiyl group, and a phthalidodiyl group. The hydrogen atom in the divalent organic group may be substituted with a halogen atom, such as a fluorine atom or a chlorine atom; an alkoxy group, such as a methoxy group or a phenoxy group; a cyano group; or the like. Examples of the divalent organic group having from 1 to 10 nitrogen atoms in Z of Formula (5) include an imino group and a polyimide group.

In addition, Examples of Z in Formula (5) include those with structures represented by Formula (6) below or Formula (7) below:

[Chem. 11]

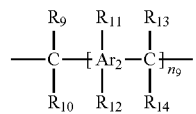

(6)

in Formula (6), Ar$_2$ is selected from any one of a phenylene group, a naphthylene group, and a biphenylene group; $R_9$, $R_{10}$, $R_{13}$, and $R_{14}$ are each independently selected from any one of a hydrogen atom, an alkyl group having from 1 to 6 carbon atoms, an aryl group having from 6 to 12 carbon atoms, and an aryl group substituted with at least one of a trifluoromethyl group or a phenolic hydroxy group; $R_{11}$ and $R_{12}$ are each independently selected from any one of a hydrogen atom, an alkyl group having from 1 to 6 carbon atoms, an aryl group having from 6 to 12 carbon atoms, an alkoxy group having from 1 to 4 carbon atoms, and a hydroxy group; and $n_9$ represents an integer of 0 to 5, but the cyanate ester compound (B) may be a mixture of compounds having groups represented by Formula (6) differing in $n_9$; and

[Chem. 12]

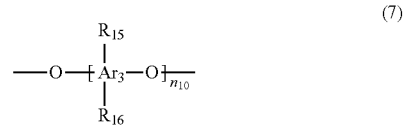

(7)

in Formula (7), Ar$_3$ is selected from any one of a phenylene group, a naphthylene group, or a biphenylene group; $R_{15}$ and $R_{16}$ are each independently selected from any one of a hydrogen atom, an alkyl group having from 1 to 6 carbon atoms, an aryl group having from 6 to 12 carbon atoms, a benzyl group, an alkoxy group having from 1 to 4 carbon atoms, and an aryl group substituted with at least one of a hydroxy group, a trifluoromethyl group, or a cyanate group; and $n_{10}$ represents an integer of from 0 to 5, but the cyanate ester compound (B) may be a mixture of compounds having groups represented by Formula (7) differing in $n_{10}$.

Furthermore, examples of Z in Formula (5) include divalent groups represented by the formulas below.

[Chem. 13]

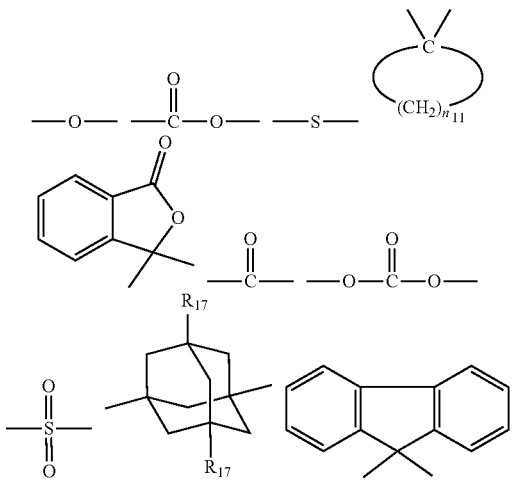

where $n_{11}$ represents an integer of from 4 to 7; and $R_{17}$'s each independently represent a hydrogen atom or an alkyl group having from 1 to 6 carbon atoms.

Specific examples of Ar$_2$ of Formula (6) and Ar$_3$ of Formula (7) include a 1,4-phenylene group, a 1,3-phenylene group, a 4,4'-biphenylene group, a 2,4'-biphenylene group, a 2,2'-biphenylene group, a 2,3'-biphenylene group, a 3,3'-biphenylene group, a 3,4'-biphenylene group, a 2,6-naphthylene group, a 1,5-naphthylene group, a 1,6-naphthylene group, a 1,8-naphthylene group, a 1,3-naphthylene group, and a 1,4-naphthylene group. The alkyl group and the aryl group in $R_9$ to $R_{14}$ of Formula (6) and $R_{15}$ and $R_{16}$ of Formula (7) are similar to those described in Formula (5).

Examples of the cyanate ester compound represented by Formula (5) include phenol novolac cyanate ester compounds, naphthol aralkyl cyanate ester compounds, biphenyl aralkyl cyanate ester compounds, naphthylene ether cyanate ester compounds, xylene resin cyanate ester compounds, adamantane skeleton cyanate ester compounds, bisphenol A type cyanate ester compounds, diallyl bisphenol A type cyanate ester compounds, and naphthol aralkyl cyanate ester compounds.

Specific examples of the cyanate ester compound represented by Formula (5) include, but not particularly limited to, cyanatobenzene, 1-cyanato-2-, 1-cyanato-3-, or 1-cyanto-4-methylbenzene, 1-cyanto-2-, 1-cyanato-3-, or 1-cyanto-4-methoxybenzene, 1-cyanato-2,3-, 1-cyanato-2,4-, 1-cyanato-2,5-, 1-cyanato-2,6-, 1-cyanato-3,4-, or 1-cyanto-3,5-dimethylbenzene, cyanatoethylbenzene, cyanatobutylbenzene, cyanatooctylbenzene, cyanatononylbenzene, 2-(4-cyanaphenyl)-2-phenylpropane (a cyanate of 4-α-cumylphenol), 1-cyanato-4-cyclohexylbenzene, 1-cyanato-4-vinylbenzene, 1-cyanato-2- or 1-cyanto-3-chlorobenzene, 1-cyanato-2,6-dichlorobenzene, 1-cyanato-2-methyl-3-chlorobenzene, cyanatonitrobenzene, 1-cyanto-4-nitro-2-ethylbenzene, 1-cyanato-2-methoxy-4-allylbenzene (a cyanate of eugenol), methyl(4-cyanatophenyl)sulfide, 1-cyanato-3-trifluoromethylbenzene, 4-cyanatobiphenyl, 1-cyanato-2- or 1-cyanto-4-acetylbenzene, 4-cyanatobenzaldehyde, methyl 4-cyanatobenzoate ester, phenyl 4-cyanatobenzoate ester, 1-cyanato-4-acetoaminobenzene, 4-cyanatobenzophenone, 1-cyanto-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-dimethylbenzene, 1,3-dicyanato-2,4,6-trimethylbenzene, 1,3-dicyanato-5-methylbenzene, 1-cyanato or 2-cyanatonaphthalene, 1-cyanato 4-methoxynaphthalene, 2-cyanato-6-methylnaphthalene, 2-cyanato-7-methoxynaphthalene, 2,2'-dicyanato-1,1'-binaphthyl, 1,3-, 1,4-, 1,5-, 1,6-, 1,7-, 2,3-, 2,6-, or 2,7-dicyanatosinaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl)methane, 1,1-bis(4-cyanatophenyl)ethane, 1,1-bis(4-cyanatophenyl)propane, 2,2-bis(4-cyanatophenyl)propane, 2,2-bis (3-allyl-4-cyanatophenyl)propane, 2,2-bis(4-cyanato-3-methylphenyl)propane, 2,2-bis(2-cyanato-5-biphenylyl)propane, 2,2-bis(4-cyanatophenyl)hexafluoropropane, 2,2-bis (4-cyanato-3,5-dimethylphenyl)propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis(4-cyanatophenyl)pentane, 2,2-bis(4-cyanatophenyl)hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatophenyl)cyclohexane, 2,2-bis(4-cyanato-3-isopropylphenyl) propane, 1,1-bis(3-cyclohexyl-4-cyanatophenyl) cyclohexane, bis(4-cyanatophenyl)diphenylmethane, bis(4-cyanatophenyl)-2,2-dichloroethylene, 1,3-bis[2-(4-cyanatophenyl)-2-propyl]benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propene-1-one, bis(4-cyanatophenyl)ether, bis(4-cyanatophenyl)sulfide, bis(4-cyanatophenyl)sulfone, 4-cyanatobenzoic acid-4-cyanatophenyl ester (4-cyanatophenyl-4-cyanatobenzoate), bis-(4-cyanatophenyl)carbonate, 1,3-bis(4-cyanatophenyl)adamantane, 1,3-bis(4-cyanatophenyl)-5,7-dimethyladamantane, 3,3-bis(4-cyanatophenyl)isobenzofuran-1(3H)-one (a cyanate of phenolphthalein), 3,3-bis(4-cyanato-3-methylphenyl) isobenzofuran-1(3H)-one (a cyanate of o-cresolphthalein), 9,9-bis(4-cyanatophenyl)fluorene, 9,9-bis(4-cyanatoto-3-methylphenyl)fluorene, 9,9-bis(2-cyanato-5-biphenylyl) fluorene, tris(4-cyanatophenyl)methane, 1,1,1-tris(4-cyanatophenyl)ethane, 1,1,3-tris(4-cyanatophenyl)propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3, 5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4, 4'-oxydiphthalimide, bis(N-4-cyanatophenyl)-4,4'-oxydiphthalimide, bis(N-4-cyanato-2-methylphenyl)-4,4'-(hexafluoroisopropylidene)diphthalimide, tris(3,5-dimethyl-4-cianatobenzyl)isocyanurate, 2-phenyl-3,3-bis(4-cyanatophenyl)phthalimidine, 2-(4-methylphenyl)-3,3-bis (4-cyanatophenyl)phthalimidine, 2-phenyl-3,3-bis(4-cyanato-3-methylphenyl)phthalimidine, 1-methyl-3,3-bis(4-cyanatophenyl)indolin-2-one, 2-phenyl-3,3-bis(4-cyanatophenyl)indolin-2-one; and compounds obtained by cyanate esterification of a phenolic resin, such as a phenol novolac resin and a cresol novolac resin (a resin obtained by reacting phenol, an alkyl-substituted phenol, or a halogen-substituted phenol with a formaldehyde compound, such as fornalin or paraformaldehyde, in an acidic solution according to a well-known method), a trisphenol novolac resin (a resin obtained by reacting hydroxybenzaldehyde with phenol in the presence of an acid catalyst), a fluorene novolac resin (a resin obtained by reacting a fluorenone compound with a 9,9-bis(hydroxyaiyl)fluorene in the presence of an acid catalyst), a phenol aralkyl resin, a cresol aralkyl resin, a naphthol aralkyl resin, and a biphenyl aralkyl resin (a resin obtained by reacting a bishalogenomethyl compound, such as a compound represented by $Ar_4$—$(CH_2Z')_2$, with a phenolic compound by an acid catalyst or without catalyst according to a well-known method; a resin obtained by reacting a bis(alkoxymethyl) compound, such as a compound represented by $Ar_4$—$(CH_2OR)_2$, or a bis(hydroxymethyl) compound, such as a compound represented by $Ar_4$—$(CH_2OH)_2$, with a phenolic compound in the presence of an acid catalyst according to a well-known method; or a resin obtained by polycondensation of an aromatic aldehyde compound, an aralkyl compound, and a phenolic compound according to a well-known method), a phenol-modified xylene formaldehyde resin (a resin obtained by reacting a xylene fornaldehyde resin with a phenolic compound in the presence of an acid catalyst according to a well-known method), a modified naphthalene formaldehyde resin (a resin obtained by reacting a naphthalene fonnaldehyde resin with a hydroxy-substituted aromatic compound in the presence of an acid catalyst according to a well-known method), a phenol-modified dicyclopentadiene resin, and a phenolic resin having a polynaphthylene ether structure (a resin obtained by dehydration condensation of a polyvalent hydroxynaphthalene compound having two or more phenolic hydroxy groups in one molecule in the presence of a basic catalyst according to a well-known method), according to a similar method described above. These cyanate ester compounds may be used alone, or two or more may be used in combination.

Among these cyanate ester compounds, phenol novolac cyanate ester compounds, naphthol aralkyl cyanate ester compounds, naphthylene ether cyanate ester compounds, bisphenol A type cyanate ester compounds, bisphenol M type cyanate ester compounds, and diallyl bisphenol cyanate ester compounds are preferred, and naphthol aralkyl cyanate ester compounds are particularly preferred.

A cured product of the resin composition produced using these cyanate ester compounds has excellent properties, such as heat resistance and low dielectric properties (low dielectric constant properties and low dielectric loss tangent properties).

The content of the cyanate ester compound (B) in the resin composition according to the present embodiment can be set appropriately according to the desired properties and is not particularly limited. Specifically, the content of the cyanate ester compound (B) is preferably not less than 1 part by mass, more preferably not less than 5 parts by mass, even more preferably not less than 10 parts by mass, and may be not less than 12 parts by mass, not less than 15 parts by mass, or not less than 20 parts by mass when resin solid component in the resin composition are 100 parts by mass. In addition, the upper limit of the content is preferably not more than 90 parts by mass, more preferably not more than 80 parts by mass, even more preferably not more than 70 parts by mass, still more preferably not more than 60 parts by mass, and may be not more than 50 parts by mass or not more than 40 parts by mass. The resin composition with the content of the cyanate ester compound (B) in such a range can provide even better low dielectric constant properties and low dielectric loss tangent properties.

Only one cyanate ester compound (B) may be used, or two or more may be used. when two or more cyanate ester compounds (B) are used, their total amount is preferably in the above range.

Polyphenylene Ether Compound (C)

The polyphenylene ether compound (C) according to the present embodiment is a compound represented by Formula (1). The resin composition according to the present embodiment contains a polyphenylene ether compound having such a structure and thus, when used in materials for printed wiring boards (e.g., laminates or metal foil-clad laminates) or the like, provides excellent low dielectric loss tangent properties and a uniform cured product.

The polyphenylene ether compound (C) represented by Formula (1) used in the present embodiment has a number average molecular weight of not lower than 1000 and not higher than 7000. The polyphenylene ether compound (C) with a number average molecular weight of not higher than 7000 allows the resin composition to have sufficient fluidity during molding. In addition, the polyphenylene ether compound (C) with a number average molecular weight of not lower than 1000 can provide inherent, excellent dielectric properties (low dielectric constant properties and low dielectric loss tangent properties) of the polyphenylene ether resin. In particular, to obtain even better fluidity, heat resistance, and dielectric properties, the number average molecular weight of the polyphenylene ether compound (C) is preferably not lower than 1100 and not higher than 5000. The number average molecular weight of the polyphenylene ether compound (C) is more preferably not higher than 4500, and the number average molecular weight of the polyphenylene ether compound (C) is even more preferably not higher than 3000. The number average molecular weight is measured using gel permeation chromatography according to the common method.

The polyphenylene ether compound (C) represented by Formula (1) used in the present embodiment preferably has a minimum melt viscosity of not higher than 50000 Pa·s. The polyphenylene ether compound (C) with a minimum melt viscosity of not higher than 50000 Pa·s allows the resin composition to have sufficient fluidity, enabling multilayer molding. The lower limit of the minimum melt viscosity is not particularly specified but may be, for example, not lower than 1000 Pa·s.

The polyphenylene ether compound (C) represented by Formula (1) preferably contains a polymer of a constituent unit represented by Formula (8) below:

[Chem. 14]

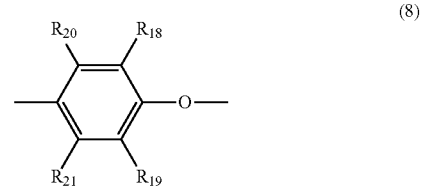

(8)

in Formula (8), $R_{18}$, $R_{19}$, $R_{20}$, and $R_{21}$ each independently represent an alkyl group having 6 or less carbon atoms, an aryl group, a halogen atom, or a hydrogen atom.

The polymer may further contain at least one structural unit selected from the group consisting of structural units represented by Formula (9) and Formula (10):

[Chem. 15]

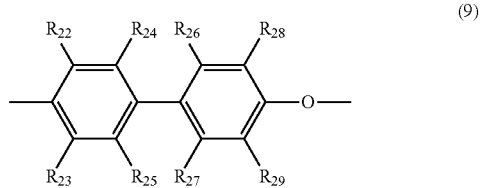

(9)

in Formula (9), $R_{22}$, $R_{23}$, $R_{24}$, $R_{28}$, and $R_{29}$ each independently represent an alkyl group having 6 or less carbon atoms or a phenyl group; and $R_{25}$, $R_{26}$, and $R_{27}$ each independently represent a hydrogen atom, an alkyl group having 6 or less carbon atoms, or a phenyl group; and

[Chem. 16]

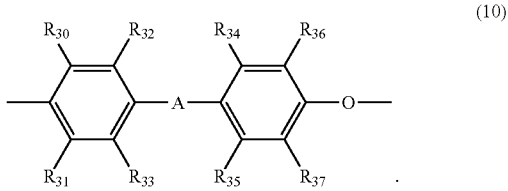
(10)

in Formula (10), $R_{30}$, $R_{31}$, $R_{32}$, $R_{33}$, $R_{34}$, $R_{35}$, $R_{36}$, and $R_{37}$ each independently represent a hydrogen atom, an alkyl group having 6 or less carbon atoms, or a phenyl group; and -A- is a linear, branched, or cyclic divalent hydrocarbon group having 20 or less carbon atoms.

In relation to Formula (1), Formulas (8), (9), and (10) above are preferably —(Y—O)— of Formula (1). —(Y—O)— has $n_2$ (1 to 100) repeating units.

In Formula (1), X represents an aryl group (aromatic group); —(Y—O)$n_2$- represents a polyphenylene ether moiety; $R_1$, $R_2$, and $R_3$ each independently represent a hydrogen atom, an alkyl group, an alkenyl group, or an alkynyl group; $n_2$ represents an integer of 1 to 100; $n_1$ represents an integer of from 1 to 6; and $n_3$ represents an integer of from 1 to 4. $n_1$ is preferably an integer of not less than 1 and not more than 4, more preferably 1 or 2, and ideally 1. In addition, $n_3$ is preferably an integer of not less than 1 and not more than 3, more preferably 1 or 2, and ideally 2.

For the aryl group in X of Formula (1), an aromatic hydrocarbon group can be used. Specifically, a group obtained by removing $n_3$ hydrogen atom or hydrogen atoms from one ring structure selected from a benzene ring structure, a biphenyl structure, an indenyl ring structure, and a naphthalene ring structure (e.g., a phenyl group, a biphenyl group, an indenyl group, and a naphthyl group) can be used, and a biphenyl group is preferably used. Here, the aryl group may include a diphenyl ether group in which the above aiyl groups are bonded with an oxygen atom, a benzophenone group in which the above aryl groups are bonded with a carbonyl group, and a 2,2-diphenylpropane group in which the above aryl groups are bonded with an alkylene group. In addition, the aryl group may be substituted with a common substituent, such as an alkyl group (suitably an alkyl group having from 1 to 6 carbon atoms and particularly a methyl group), an alkenyl group, an alkynyl group, or a halogen atom. However, the "aryl group" is substituted with a polyphenylene ether moiety via an oxygen atom, the limit of the number of the common substituent depends on the number of the polyphenylene ether moiety.

The polyphenylene ether compound (C) particularly preferably contains a polyphenylene ether represented by a structure of Formula (11) below:

[Chem. 17]

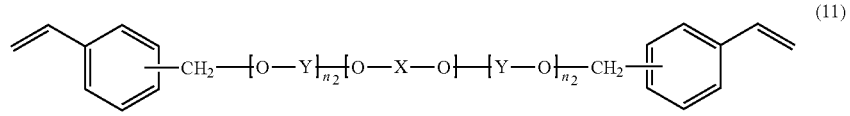
(11)

in Formula (11), X is an aryl group (aromatic group); each —(Y—O)$_{n2}$— independently represents a polyphenylene ether moiety; and each $n_2$ independently represents an integer of 1 to 100.

—(Y—O)$_{n2}$— and $n_2$ are synonymous with those in Formula (1). The polyphenylene ether compound (C) may contain a plurality of compounds differing in $n_2$.

X in Formula (1) and Formula (11) is preferably Formula (12), Formula (13), or Formula (14), and —(Y—O)$_{n2}$— in Formula (1) and Formula (11) is more preferably a structure in which Formula (15) or Formula (16) is arranged or a structure in which Formula (15) and Formula (16) are randomly arranged:

[Chem. 18]

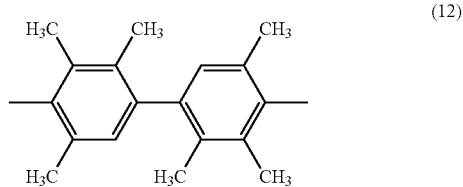
(12)

[Chem. 19]

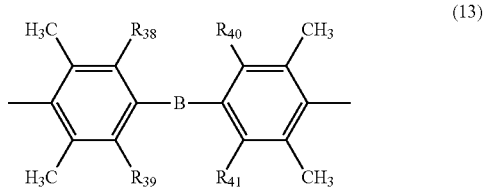
(13)

in Formula (13), $R_{38}$, $R_{39}$, $R_{40}$, and $R_{41}$ each independently represent a hydrogen atom or a methyl group; —B— is a linear, branched, or cyclic divalent hydrocarbon group having 20 or less carbon atoms.

[Chem. 20]

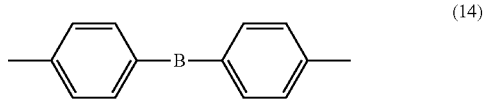
(14)

in Formula (14), —B— is a linear, branched, or cyclic divalent hydrocarbon group having 20 or less carbon atoms.

[Chem. 21]

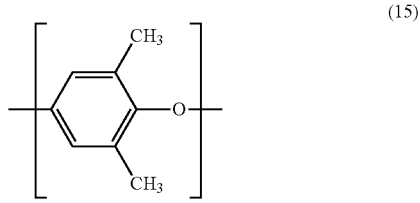

(15)

[Chem. 22]

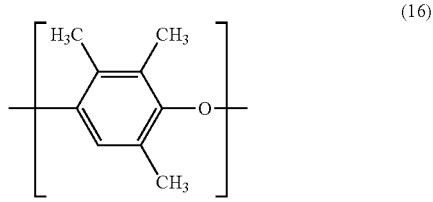

(16)

The method for producing the modified polyphenylene ether having a structure represented by Formula (11) is not particularly limited, and the modified polyphenylene ether can be produced, for example, by vinylbenzyl etherification of a terminal phenolic hydroxy group of a bifunctional phenylene ether oligomer obtained by oxidative coupling of a bifunctional phenolic compound and a monofunctional phenolic compound.

In addition, a commercially available product of such a modified polyphenylene ether can be used, and, for example, OPE-2St 1200 and OPE-2st 2200 available from Mitsubishi Gas Chemical Company, Inc. can be suitably used.

The content of the polyphenylene ether compound (C) in the resin composition according to the present embodiment is preferably not less than 1 part by mass, more preferably not less than 5 parts by mass, and even more preferably not less than 8 parts by mass relative to 100 parts by mass of resin solid component of the resin composition. In addition, the upper limit of the content is preferably not more than 40 parts by mass, more preferably not more than 30 parts by mass, and may be not more than 25 parts by mass. The resin composition with the content of the polyphenylene ether compound (C) in such a range tends to achieve low dielectric constant properties, low dielectric loss tangent properties, and good moldability more effectively. The resin composition may contain only one polyphenylene ether compound (C) or may contain two or more polyphenylene ether compounds (C). The resin composition containing two or more polyphenylene ether compounds (C) preferably has a total amount of the polyphenylene ether compounds (C) in the above range.

Block Copolymer (D) Having Styrene Backbone

The "block copolymer (D) having a styrene backbone" according to the present embodiment refers to an elastomer that is a block copolymer having a polystyrene block structure and contains no random copolymer. In addition, a compound containing only an aromatic vinyl compound is distinctively referred to as a "styrene oligomer (E)" and is not included in the "block copolymer (D) having a styrene backbone".

The resin composition according to the present embodiment preferably contains at least one block copolymer (D) selected from the group consisting of a styrene-butadiene block copolymer, a styrene-isoprene block copolymer, a styrene-hydrogenated butadiene block copolymer, a styrene-hydrogenated isoprene block copolymer, and a styrene-hydrogenated (isoprene/butadiene) block copolymer. These block copolymers may be used alone, or two or more may be used in combination. In particular, a styrene-isoprene block copolymer, a styrene-hydrogenated butadiene block copolymer, a styrene-hydrogenated isoprene block copolymer, and a styrene-hydrogenated (butadiene/isoprene) block copolymer provide even better low dielectric loss tangent properties and thus are preferred.

For the polystyrene block structure in the present embodiment, a styrene having a substituent may be used. Specifically, a styrene derivative, such as α-methylstyrene, 3-methylstyrene, 4-propylstyrene, or 4-cyclohexylstyrene, can be used.

The styrene content in the block copolymer (D) having a styrene backbone (hereinafter, also referred to as "styrene ratio") is not particularly limited but is preferably not less than 10 mass % and more preferably not less than 20 mass %. The upper limit of the styrene content is not particularly limited when it is less than 100 mass % but is, for example, preferably less than 99 mass % and more preferably not more than 70 mass %. The block copolymer (D) contained in such a range tends to improve solubility in solvents and miscibility with other compounds. Here, the styrene content is a value expressed by (a)/(b)×100 (unit: %), where the mass of the styrene unit contained in the block copolymer (D) having a styrene backbone is (a) g, and the mass of the entire block copolymer (D) having a styrene backbone is (b) g.

The content of the block copolymer (D) having a styrene backbone in the resin composition according to the present embodiment is preferably not less than 1 part by mass, preferably not less than 5 parts by mass, and may be not less than 8 parts by mass relative to 100 parts by mass of resin solid component of the resin composition. The upper limit of the content is preferably not more than 30 parts by mass, more preferably not more than 25 parts by mass, and even more preferably not more than 22 parts by mass. The resin composition with the content of the block copolymer (D) in such a range tends to have even better low dielectric constant properties, low dielectric loss tangent properties, and good moldability. In the present embodiment, two or more block copolymers (D) may be contained. When two or more block copolymers (D) are contained, their total amount is preferably in the above range.

The resin composition may contain only one block copolymer (D) having a styrene backbone or may contain two or more block copolymers (D) having a styrene backbone. The resin composition containing two or more block copolymers (D) preferably has a total amount of the block copolymers (D) in the above range.

For the block copolymer (D) having a styrene backbone in the present embodiment, a commercially available product may be used, and examples of the styrene-butadiene-styrene block copolymer include TR2630 (available from JSR Corporation) and TR2003 (available from JSR Corporation). In addition, examples of the styrene-isoprene-styrene block copolymers include SIS5250 (available from JSR Corporation). Examples of the styrene-hydrogenated isoprene-styrene block copolymers include SEPTON2104 (available from Kuraray Co., Ltd.).

Styrene Oligomer (E)

The resin composition according to the present embodiment desirably contains a styrene oligomer (E) to improve low dielectric constant properties and low dielectric loss tangent properties. The "styrene oligomer (E)" used in the present embodiment is distinguished from the "block copolymer (D) having a styrene backbone" described above.

The styrene oligomer according to the present embodiment is a compound formed by polymerization of at least one selected from the group consisting of styrene and styrene derivatives, and vinyltoluene, the compound having a number average molecular weight of 178 to 1600, from 2 to 14 aromatic rings on average, a total amount of the 2 to 14 aromatic rings of not less than 50 mass %, and a boiling point of not lower than 300° C., and having no branched structure.

Examples of the styrene oligomer (E) used in the present embodiment include a styrene polymer, a vinyl toluene polymer, an α-methylstyrene polymer, a vinyltoluene-α-methylstyrene polymer, and a styrene-α-styrene polymer. For the styrene polymer, a commercially available product may be used, and examples include Piccolastic A5 (available from Eastman Chemical), Piccolastic A-75 (available from Eastman Chemical), Piccotex 75 (available from Eastman Chemical), FTR-8100 (available from Mitsui Chemicals, Inc.), and FTR-8120 (available from Mitsui Chemicals, Inc.). In addition, examples of the vinyl toluene-α-methylstyrene polymers include Piccotex LC (available from Eastman Chemical). Furthermore, examples of the α-methylstyrene polymers include Crystalex 3070 (available from Eastman Chemical), Crystalex 3085 (available from Eastman Chemical), Crystalex (3100), Crystalex 5140 (available from Eastman Chemical), FMR-0100 (available from Mitsui Chemicals, Inc.), and FMR-0150 (available from Mitsui Chemicals, Inc.). Moreover, examples of the styrene-α-styrene polymers include FTR-2120 (available from Mitsui Chemicals, Inc.). These styrene oligomers may be used alone, or two or more may be used in combination.

The content of the styrene oligomer (E), when contained, in the resin composition according to the present embodiment is preferably not less than 1 parts by mass and not more than 30 parts by mass relative to 100 parts by mass of resin solid component of the resin composition in terms of low dielectric constant properties, low dielectric loss tangent properties, and chemical resistance, and particularly preferably not less than 5 parts by mass and not more than 20 parts by mass, and may be not more than 15 parts by mass.

The resin composition may contain only one styrene oligomer (E) or may contain two or more styrene oligomers (E). The resin composition containing two or more styrene oligomers (E) preferably has a total amount of the styrene oligomers (E) in the above range.

Filler (F)

The resin composition according to the present embodiment desirably contains a filler (F) to improve low dielectric constant properties, low dielectric loss tangent properties, flame resistance, and low thermal expansivity. For the filler (F) used in the present embodiment, a well-known filler can be appropriately used, the type of the filler is not particularly limited, and a filler commonly used in the art can be suitably used. Specifically, examples of the filler include silica, such as natural silica, fused silica, synthetic silica, amorphous silica, Aerosil, and hollow silica; metal hydrates, such as white carbon, titanium white, zinc oxide, magnesium oxide, zirconium oxide, boron nitride, aggregated boron nitride, silicon nitride, aluminum nitride, barium sulfate, aluminum hydroxide, and an aluminum hydroxide heat-treated product (a product obtained by heating aluminum hydroxide to reduce a part of the crystalline water), boehmite, and magnesium hydroxide; molybdenum compounds, such as molybdenum oxide and zinc molybdate; inorganic-based fillers, such as zinc borate, zinc stannate, alumina, clay, kaolin, talc, calcined clay, calcined kaolin, calcined talc, mica, E-glass, A-glass, NE-glass, C-glass, L-glass, D-glass, S-glass, M-glass G20, glass short fibers (including glass fine powders of E-glass, T-glass, D-glass, S-glass, Q-glass, and the like), hollow glass, and spherical glass; and in addition, organic-based fillers, such as rubber powders (such as styrene, butadiene, and acrylic rubber powders), core-shell rubber powders, silicone resin powders, silicone rubber powders, and silicone composite powders. These fillers may be used alone, or two or more may be used in combination.

Among these fillers, one or two or more selected from the group consisting of silica, aluminum hydroxide, boehmite, magnesium oxide, and magnesium hydroxide are suitable. The use of one or more of these fillers improves properties, such as thermal expansion properties, dimensional stability, and flame retardancy of the resin composition.

The content of the filler (F) in the resin composition according to the present embodiment can be set appropriately according to the desired properties and is not particularly limited but is preferably not less than 50 parts by mass when resin solid component in the resin composition are 100 parts by mass. The upper limit is preferably not more than 1600 parts by mass, more preferably not more than 500 parts by mass, and particularly preferably not more than 300 parts by mass. Alternatively, the content of the filler (F) may be from 75 to 250 parts by mass or from 100 to 200 parts by mass. The resin composition with the content of the filler (F) in this range has good moldability.

The resin composition may contain only one filler (F) or may contain two or more fillers (F). The resin composition containing two or more fillers (F) preferably has a total amount of fillers (F) in the above range.

Here, the filler (F), when used, is preferably used in combination with at least one selected from the group consisting of silane coupling agents and wet dispersants. A silane coupling agent commonly used for surface treatment of inorganic materials can be suitably used, and the type of the silane coupling agent is not particularly limited. Specifically, examples of the silane coupling agent include aminosilane-based coupling agents, such as γ-aminopropyltriethoxysilane and N-β-(aminoethyl)-γ-aminopropyltrimethoxysilane; epoxysilane-based coupling agents, such as γ-glycidoxypropyltrimethoxysilane and β-(3,4-epoxycyclohexyl)ethyltrimethoxysilane; vinylsilane-based coupling agents, such as γ-methacryloxypropyltrimethoxysilane and vinyl-tri(β-methoxyethoxy)silane; cationic silane-based coupling agents, such as N-β-(N-vinylbenzylaminoethyl)-γ-aminopropyltrimethoxysilane hydrochloride; and phenylsilane-based coupling agents. The silane coupling agent may be used alone, or two or more may be used in combination. In addition, a wet dispersant commonly used for paints can be suitably used, and the type of the wet dispersant is not particularly limited. A copolymer-based wet dispersant is preferably used, and specific examples of the copolymer-based wet dispersant include Disperbyk-110, 111, 161, 180, 2009, 2152, BYK-W996, BYK-W9010, BYK-W903, and BYK-W940 available from BYK Japan KK. The wet dispersant may be used alone, or two or more may be used in combination.

The content of the silane coupling agent is not particularly limited and may be approximately from 1 mass to 5 parts by mass relative to 100 parts by mass of resin solid component in the resin composition. The content of the dispersant (in particular, the wet dispersant) is not particularly limited and may be, for example, approximately from 0.5 to 5 parts by mass relative to 100 parts by mass of resin solid component in the resin composition.

Flame Retardant (G)

The resin composition according to the present embodiment preferably contains a flame retardant (G) to improve flame resistance. For the flame retardant (G) used in the present embodiment, a well-known flame retardant can be used, and examples include halogen-based flame retardants, such as brominated epoxy resins, brominated polycarbonates, brominated polystyrenes, brominated styrenes, brominated phthalimides, tetrabromobisphenol A, pentabromobenzyl(meth)acrylates, pentabromotoluene, tribromophenols, hexabromobenzene, decabromodiphenyl ether, bis-1,2-pentabromophenylethane, chlorinated polystyrenes, and chlorinated paraffins; phosphorus-based flame retardants, such as red phosphorus, tricresyl phosphate, triphenyl phosphate, cresyl diphenyl phosphate, trixylenyl phosphate, trialkyl phosphate, dialkyl phosphate, tris(chloroethyl) phosphate, phosphazene, 1,3-phenylene bis(2,6-dixylenylphosphate), and 10-(2,5-dihydroxyphenyl)-10H-9-oxa-10-phosphaphenanthrene-10-oxide; inorganic-based flame retardants, such as aluminum hydroxide, magnesium hydroxide, partial boehmite, boehmite, zinc borate, and antimony trioxide; and silicone-based retardants, such as silicone rubbers and silicone resins. These flame retardants may be used alone, or two or more may be used in combination. Among them, phosphorus-based flame retardants are preferred, and in particular, 1,3-phenylene bis(2,6-dixylenylphosphate) is preferred in terms of hardly impairing the low dielectric properties. The phosphorus content in the resin composition is preferably from 0.1 to 5 mass %.

The content of the flame retardant (G), when contained, is preferably not less than 1 part by mass and more preferably not less than 5 parts by mass relative to 100 parts by mass of resin solid component in the resin composition. In addition, the upper limit of the content is preferably not more than 30 parts by mass, more preferably not more than 20 parts by mass, and may be not more than 15 parts by mass.

Only one flame retardant (G) may be used, or two or more may be used. When two or more flame retardants (G) are used, their total amount is preferably in the above range.

Additional Component

Furthermore, in view of desired properties, the resin composition according to the present embodiment may contain a polyphenylene ether compound other than the polyphenylene ether compound (C), an epoxy resin, a phenolic resin, an oxetane resin, a benzoxazine compound, and a thermoplastic elastomer not described in "4. Block copolymer (D) having a styrene backbone" (hereinafter referred to as the "additional thermoplastic elastomer"), a curing accelerator, an organic solvent, or the like. The use of these components in combination can improve the desired properties, such as flame retardancy and low dielectric properties, of a cured product obtained by curing the resin composition.

In the resin composition according to the present embodiment, a total amount of a polyphenylene ether compound other than the polyphenylene ether compound (C) and an additional thermoplastic elastomer is preferably not more than 3 mass % and more preferably not more than 1 mass %. The resin composition with such a constitution more effectively exhibits the effect of the present invention.

Epoxy Resin

The epoxy resin is not particularly limited as long as the epoxy resin is a compound or resin having two or more epoxy groups in one molecule, and examples include bisphenol A type epoxy resins, bisphenol E type epoxy resins, bisphenol F type epoxy resins, bisphenol S type epoxy resins, phenol novolac epoxy resins, bisphenol A type novolac epoxy resins, glycidyl ester epoxy resins, aralkyl novolac epoxy resins, biphenyl aralkyl epoxy resins, naphthylene ether epoxy resins, cresol novolac epoxy resins, polyfunctional phenol epoxy resins, naphthalene epoxy resins, anthracene epoxy resins, naphthylene skeleton-modified novolac epoxy resins, phenol aralkyl epoxy resins, naphthol aralkyl epoxy resins, dicyclopentadiene epoxy resins, biphenyl epoxy resins, alicyclic epoxy resins, polyol epoxy resins, phosphorus-containing epoxy resins, glycidyl amine, glycidyl ester, compounds obtained by epoxidation of a double bond of butadiene or the like, and compounds obtained by reaction of a hydroxy group-containing silicone resin and epichlorohydrin. These epoxy resins may be used alone, or two or more may be used in combination. Among these epoxy resins, in terms of further improving flame retardancy and heat resistance, the epoxy resin is preferably a biphenyl aralkyl epoxy resin, a naphthylene ether epoxy resin, a polyfunctional phenol epoxy resin, and a naphthalene epoxy resin.

Phenolic Resin

The phenolic resin is not particularly limited as long as the phenolic resin is a compound or resin having two or more epoxy groups in one molecule, and examples include bisphenol A type phenolic resins, bisphenol E type phenolic resins, bisphenol F type phenolic resins, bisphenol S type phenolic resins, phenol novolac phenolic resins, bisphenol A type novolac phenolic resins, glycidyl ester phenolic resins, aralkyl novolac phenolic resins, biphenyl aralkyl phenolic resins, cresol novolac phenolic resins, polyfunctional phenol phenolic resins, naphthol resins, naphthol novolac resins, polyfunctional naphthol resins, anthracene phenolic resins, naphthylene skeleton-modified novolac phenolic resins, phenol aralkyl phenolic resins, naphthol aralkyl phenolic resins, dicyclopentadiene phenolic resins, biphenyl phenolic resins, alicyclic phenolic resins, polyol phenolic resins, phosphorus-containing phenolic resins, and hydroxy group-containing silicone resins. These phenolic resins may be used alone, or two or more may be used in combination. Among these epoxy resins, in terms of further improving flame resistance, the phenolic resin is preferably at least one selected from the group consisting of biphenyl aralkyl phenolic resins, naphthol aralkyl phenolic resins, phosphorus-containing phenolic resins, and hydroxy group-containing silicone resins.

Oxetane Resin

The oxetane resin is not particularly limited, and examples include oxetane, alkyl oxetanes (e.g., such as 2-methyloxetane, 2,2-dimethyloxetane, 3-methyloxetane, and 3,3-dimethyloxetane), 3-mehyl-3-methoxymethyloxetane, 3,3-di(trifluoromethyl)perfluorooxetane, 2-chloromethyloxetane, 3,3-bis(chloromethyl)oxetane, biphenyl oxetane, OXT-101 (a product from Toagosei Co., Ltd.), and OXT-121 (a product from Toagosei Co., Ltd.). These oxetane resins may be used alone, or two or more may be used in combination.

Benzoxazine Compound

The benzoxazine compound is not particularly limited as long as the benzoxazine compound is a compound having two or more dihydrobenzoxazine rings in one molecule, and examples include bisphenol a benzoxazine BA-BXZ (a product from of Konishi Chemical Ind. Co., Ltd.), bisphenol F type benzoxazine BF-BXZ (a product from Konishi Chemical Ind. Co., Ltd.), and bisphenol S type benzoxazine BS-BXZ (a product from Konishi Chemical Ind. Co., Ltd.). These benzoxazine compounds may be used alone, or two or more may be used in combination.

Additional Thermoplastic Elastomer

The "additional thermoplastic elastomer" is distinguished from the "block copolymer (D) having a styrene backbone". The "block copolymer (D) having a styrene backbone" refers to an elastomer that has a polystyrene block structure and is a block copolymer, and the "additional thermoplastic elastomer" refers to an elastomer other than the block copolymer (D) having a styrene backbone. That is, elastomers, such as random copolymers and block copolymers having no styrene backbone, correspond to the additional thermoplastic elastomer. Examples of the additional thermoplastic elastomer include at least one selected from the group consisting of polyisoprene, polybutadiene, styrene-butadiene random copolymers, butyl rubbers, ethylene propylene rubbers, fluorine rubbers, silicone rubbers, hydrogenated compounds thereof, and alkyl compounds thereof. Among them, in terms of even better miscibility with the polyphenylene ether compound (C), the additional thermoplastic elastomer is more preferably at least one selected from the group consisting of polyisoprene, polybutadiene, styrene-butadiene random copolymers, butyl rubbers, and ethylene propylene rubbers.

Curing Accelerator

The resin composition according to the present embodiment may contain a curing accelerator for appropriately adjusting the curing rate. Examples of the curing accelerator include those commonly used as curing accelerators, such as maleimide compounds, cyanate ester compounds, and epoxy resins, including organometal salts (e.g., such as zinc octylate, zinc naphthenate, cobalt naphthenate, copper naphthenate, iron acetylacetone, nickel octylate, and manganese octylate); phenolic compounds (e.g., such as phenol, xylenol, cresol, resorcin, catechol, octylphenol, and nonylphenol); alcohols (e.g., such as 1-butanol and 2-ethylhexanol); imidazoles (e.g. such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole); derivatives of these imidazoles, such as adducts of carboxylic acids or their acid anhydrides; amines (e.g. such as dicyandiamide, benzyldimethylamine, and 4-methyl-N,N-dimethylbenzylamine); phosphorus compounds (e.g., such as phosphine-based compounds, phosphine oxide-based compounds, phosphonium salt-based compounds, and diphosphine-based compounds); epoxy-imidazole adduct-based compounds; peroxides (e.g., such as benzoyl peroxide, p-chlorobenzoyl peroxide, di-t-butyl peroxide, diisopropyl peroxycarbonate, and di-2-ethylhexyl peroxydicarbonate); and azo compounds (e.g., such as azobisisobutyronitrile). The curing accelerator may be used alone, or two or more may be used in combination.

The content of the curing accelerator may typically approximately from 0.005 to 10 parts by mass relative to 100 parts by mass of resin solid component in the resin composition.

The resin composition according to the present embodiment may contain a polymer compound of various types, such as an additional thermosetting resin or thermoplastic resin other than the above components, and its oligomer, and an additive of various types. Examples of the additive include ultraviolet absorbers, antioxidants, photopolymerization initiators, fluorescent brightening agents, photosensitizers, dyes, pigments, thickeners, fluidity modifiers, lubricants, antifoaming agents, dispersants, leveling agents, brighteners, and polymerization inhibitors. These additives may be used alone, or two or more may be used in combination.

Organic Solvent

The resin composition according to the present embodiment may contain an organic solvent. In this case, the resin composition according to the present embodiment is in a form (a solution or a varnish) in which at least some and preferably all of the various resin components described above are dissolved in or c with an organic solvent. The organic solvent is not particularly limited as long as it is a polar organic solvent or a non-polar organic solvent capable of dissolving or miscible with at least some and preferably all of the various resin components described above. Examples of the polar organic solvent include ketones (e.g. such as acetone, methyl ethyl ketone, and methyl isobutyl ketone), Cellosolves (e.g., such as propylene glycol monomethyl ether and propylene glycol monomethyl ether acetate), esters (e.g., such as ethyl lactate, methyl acetate, ethyl acetate, butyl acetate, isoamyl acetate, ethyl lactate, methyl methoxypropionate, and methyl hydroxyisobutyrate), and amides (e.g., such as dimethoxyacetamide and dimethylfonnamide). Examples of the nonpolar organic solvent include aromatic hydrocarbons (e.g., such as toluene and xylene). These organic solvents may be used alone, or two or more may be used in combination.

Resin Composition

The resin composition according to the present embodiment can be prepared according to a common method. The preparation method is any method that can provide a resin composition unifonnly containing the maleimide compound (A), the cyanate ester compound (B), the polyphenylene ether compound (C) represented by Formula (1) and having a number average molecular weight of not lower than 1000 and 7000, the block copolymer (D) having a styrene backbone, and the additional optional component described above. For example, the resin composition according to the present embodiment can be easily prepared by sequentially blending the maleimide compound (A), the cyanate ester compound (B), the polyphenylene ether compound (C) represented by Formula (1) and having a number average molecular weight of not less than 1000 and 7000, and the block copolymer (D) having a styrene backbone in a solvent and thoroughly stirring them.

In the resin composition according to the present embodiment, a sum of masses of the maleimide compound (A), the cyanate ester compound (B), the polyphenylene ether compound (C) represented by Formula (1) and having a number average molecular weight of not lower than 1000 and not higher than 7000, and the block copolymer (D) having a styrene backbone preferably accounts for not less than 90 mass %, more preferably accounts for not less than 95 mass %, and may account for not less than 98 mass % of resin solid component contained in the resin composition.

Applications

The resin composition according to the present embodiment can be suitably used as an insulating layer of a printed wiring board or a material for a semiconductor package. The resin composition according to the present embodiment can be suitably used as materials constituting a prepreg, a metal foil-clad laminate produced using a prepreg, a resin sheet, and a printed wiring board.

Prepreg

The prepreg according to the present embodiment is formed from a substrate and a resin composition according to the present embodiment. The prepreg according to the present embodiment is obtained by, for example, a method of impregnating or coating the resin composition according to the present embodiment to the substrate and then drying at 120 to 220° C. for approximately 2 to 15 minutes to semi-cure the resin composition. In this case, the amount of the resin composition (including a cured product of the resin composition) adhered to the substrate, that is, the amount of the resin composition (including the filler (F)) relative to the total amount of the prepreg after semi-curing is preferably in a range of 20 to 99 mass %.

The substrate is not particularly limited as long as it is a substrate used in various printed wiring board materials. Examples of the material of the substrate include glass fibers (e.g., such as E-glass, D-glass, L-glass, S-glass, T-glass, Q-glass, UN-glass, NE-glass, and spherical glass), inorganic fibers other than glass (e.g., such as quartz), and organic fibers (e.g., such as polyimide, polyamide, polyester, liquid crystal polyester, and polytetrafluoroethylene). The form of the substrate is not particularly limited, and examples include woven fabrics, nonwoven fabrics, roving, chopped strand mats, and surfacing mats. These substrates may be used alone, or two or more may be used in combination. Among these substrates, a woven fabric subjected to ultra fiber opening and fine weaving is preferred in terms of dimensional stability, and a glass woven fabric subjected to a surface treatment with a silane coupling agent or the like, such as epoxy silane treatment, aminosilane treatment, or the like, is preferred in terms of moisture absorption heat resistance. In terms of electrical properties, the substrate is more preferably low dielectric glass cloth made of glass fibers, such as L-glass, NE-glass, or Q-glass, the low dielectric glass cloth exhibiting low dielectric constant properties and low dielectric loss tangent properties.

Metal Foil-Clad Laminate

A metal foil-clad laminate according to the present embodiment has one or more layered prepregs according to the present embodiment, and a metal foil disposed on one side or both sides of the layered prepregs. The metal foil-clad laminate according to the present embodiment can be produced, for example, by a method of layering one or more prepregs according to the present embodiment, disposing a metal foil on one side or both sides of the layered prepregs, and laminate-molding the layered prepregs and the disposed metal foil, more specifically, disposing a metal foil, such as a copper or aluminum foil, on one side or both sides of the layered prepregs, and laminate-molding the layered prepregs and the disposed metal foil. The metal foil is not particularly limited as long as it is a metal foil used in a material for a printed wiring board, but examples include copper foil, such as rolled copper foil and electrolytic copper foil. The thickness of the metal foil (copper foil) is not particularly limited and may be approximately from 1.5 to 70 μm. Examples of the molding method include a method commonly used in molding a laminate and a multilayer board for a printed wiring board, and more specifically, a method of laminate-molding using a multi-stage press, a multi-stage vacuum press, a continuous molding machine, an autoclave molding machine, or the like at a temperature of approximately 180 to 350° C., a heating time of approximately 100 to 300 minutes, and a surface pressure from approximately 20 to 100 kg/cm². In addition, also a multi-layer board can be formed by laminate-molding the prepreg according to the present embodiment and a separately produced wiring board for an inner layer in combination. In a method for producing a multilayer board, a multilayer board can be produced, for example, by disposing a metal foil (copper foil) of approximately 35 μm on both sides of one prepreg according to the present embodiment, laminate-molding the metal foil by the molding method described above, then forming an inner layer circuit, subjecting the inner layer circuit to blackening treatment to form an inner layer circuit board, then disposing the inner layer circuit board and the prepreg according to the present embodiment alternately one by one, further disposing a metal foil (copper foil) on the outermost layers, and laminate-molding the metal foil under the conditions described above, preferably under vacuum. The metal foil-clad laminate according to the present embodiment can be suitably used as a printed wiring board.

Printed Wiring Board

A printed wiring board according to the present embodiment includes an insulating layer and a conductor layer disposed on a surface of the insulating layer, in which the insulating layer includes a layer formed from the resin composition according to the present embodiment. Such a printed wiring board can be produced according to a common method, and the production method is not particularly limited. An example of a method for producing the printed wiring board is described below. First, the metal foil-clad laminate, such as the copper-clad laminate, described above is prepared. Then, the surface of the metal foil-clad laminate is subjected to etching treatment to form an inner layer circuit and to produce an inner layer substrate. The inner layer circuit surface of the inner layer substrate is subjected to surface treatment to increase the adhesive strength as necessary, then the required number of the prepreg described above is layered on the inner layer circuit surface, and a metal foil for an outer layer circuit is laminated on the outer side, and the laminate is heated and pressurized to integrally mold. A multilayer laminate is thus produced, the multilayer laminate in which an insulating layer formed from the substrate and a cured product of the thermosetting resin composition is fonned between the inner layer circuit and the metal foil for the outer layer circuit. Then, the multilayer laminate is subjected to hole formation for a through hole or a via hole, then a plated metal film to conduct the inner layer circuit and the metal foil for the outer layer circuit is formed on the wall surface of the hole, further the metal foil for the outer layer circuit is subjected to etching treatment to form the outer layer circuit, and the printed wiring board is produced.

The printed wiring board obtained in the above production example is configured to have an insulating layer and a conductor layer formed on a surface of the insulating layer, in which the insulating layer contains at least any of the resin composition according to the present embodiment described above or its cured product. That is, the prepreg according to the present embodiment described above (including the substrate and at least any of the resin composition according to the present embodiment impregnated or coated to the substrate or a cured product of the resin composition) and the layer of the resin composition of the metal foil-clad laminate according to the present embodiment described above (the layer containing at least any of the resin composition according to the present embodiment or its cured product) are constituted of an insulating layer containing at least any of the resin composition according to the present embodiment or its cured product.

Resin Sheet

The resin sheet according to the present embodiment includes a support and a layer formed from the resin composition according to the present embodiment disposed on a surface of the support. The resin sheet can be used as a build-up film or a diy film solder resist. The method for producing the resin sheet is not particularly limited, but examples include a method of obtaining the resin sheet by coating (painting) a solution in which the resin composition according to the present embodiment described above is dissolved in a solvent to the support and drying.

Examples of the support used here include, but not limited to, organic-based film substrates, such as polyethylene films, polypropylene films, polycarbonate films, polyethylene terephthalate films, ethylene tetrafluoroethylene copolymer films, and release films in which a release agent is coated to a surface of these films, and polyimide films; conductive foils, such as copper foils and aluminum foils; and plate-like supports, such as glass plates, SUS plates, and FRP plates.

Examples of the coating method (painting method) include a method of coating a solution in which the resin composition according to the present embodiment is dissolved in a solvent onto the support using a bar coater, a die coater, a doctor blade, a Baker applicator, or the like. In addition, the support is peeled or etched from the resin sheet after drying, the resin sheet in which the support and the resin composition are laminated, and thereby a monolayer sheet (resin sheet) can be formed. Furthermore, a monolayer sheet (resin sheet) can be obtained without using a support, for example, by feeding a solution in which the resin composition according to the embodiment described above is dissolved in a solvent into a mold having a sheet-shaped cavity and drying to mold the solution in a sheet shape.

For producing the monolayer sheet or resin sheet according to the present embodiment, the drying conditions for removing the solvent are not particularly limited, but in tenns of facilitating the removal of the solvent in the resin composition and preventing the progress of the curing of the resin composition during drying, the drying conditions are preferably at a temperature of 20° C. to 200° C. for 1 to 90 minutes. In addition, in the monolayer sheet or resin sheet, the resin composition can be used in an uncured state in which the solvent is only dried or can be used as necessary in a semi-cured (B-stage) state. Furthermore, the thickness of the resin layer of the monolayer or resin sheet according to the present embodiment can be adjusted by the concentration of the solution of the resin composition according to the present embodiment and the coating thickness and is not particularly limited but is preferably from 0.1 to 500 m in terms of facilitating the removal of the solvent during drying.

EXAMPLES

Synthesis Example 1: Synthesis of Naphthol Aralkyl Cyanate Ester Compound (SNCN)

First, 300 g (1.28 mol in terms of an OH group) of a 1-naphthol aralkyl resin (available from Nippon Steel & Sumikin Materials Co., Ltd.) and 194.6 g (1.92 mol) of triethylamine (1.5 mol relative to 1 mol of hydroxy groups) were dissolved in 1800 g of dichloromethane, and this solution was designated as a solution 1.

Under stirring and maintaining 125.9 g (2.05 mol) of cyanogen chloride (1.6 mol relative to 1 mol of hydroxy groups), 293.8 g of dichloromethane, 194.5 g of a 36% hydrochloric acid (1.92 mol) (1.5 mol relative to 1 mol of hydroxy groups), and 1205.9 g of water at a liquid temperature of −2 to −0.5° C., the solution 1 was poured thereinto over 30 minutes. After the completion of pouring the solution 1, the mixture was stirred at the same temperature for 30 minutes, and then a solution (solution 2) in which 65 g (0.64 mol) of triethylamine (0.5 mol relative to 1 mol of hydroxy groups) was dissolved in 65 g of dichloromethane was poured over 10 minutes. After the completion of pouring the solution 2, the reaction was completed by stirring at the same temperature for 30 minutes.

The reaction liquid was allowed to stand, and the organic phase and the aqueous phase were separated. The resulting organic phase was washed 5 times with 1300 g of water. The electrical conductivity of the drainage water from the fifth water washing was 5 μS/cm, confirming that a removable ionic compound was sufficiently removed by washing with water.

The organic phase after water washing was concentrated under reduced pressure, finally concentrated to dryness at 90° C. for 1 hour, and 331 g of the desired naphthol aralkyl cyanate ester compound (SNCN) (an orange viscous material) was obtained. The weight average molecular weight Mw of the resulting SNCN was 600. In addition, the IR spectrum of the SNCN showed an absorption at 2250 cm$^1$ (a cyanate ester group) and no absorption of a hydroxy group.

Example 1

A varnish was obtained by mixing 24 parts by mass of a maleimide compound (A) of Formula (2) in which all $R_4$'s are hydrogen atoms and $n_4$ is from 1 to 3 (BMI-2300 available from Daiwa Kasei Industry Co., Ltd.), 56 parts by mass of the SNCN (B) obtained from Synthesis Example 1, 10 parts by mass of a polyphenylene ether compound (C) of Formula (11) in which X is Formula (12) and —(Y—O)$n_2$- is formed by polymerization of a structural unit of Formula (15) (OPE-2St 1200 available from Mitsubishi Gas Chemical Company, Inc., number average molecular weight of 1187, vinyl group equivalent of 590 g/eq.), 10 parts by mass of a styrene-butadiene block copolymer (D) (TR2630 available from JSR Corporation, styrene ratio of 32%), and 150 parts by mass of spherical silica (F) (SC2050-MB available from Admatechs Company Limited, average particle diameter of 0.5 μm), and diluting the solids with methyl ethyl ketone to 65 mass %.

The resulting varnish was impregnated to a low dielectric glass cloth with a thickness of 0.069 mm, the glass cloth was heat-dried at 165° C. for 5 minutes using a dryer (pressure-resistant explosion-proof steam dryer available from Takasugi Mfg. Co. Ltd.), and a prepreg with a resin composition content of 60 mass % was obtained. For one or four prepregs layered, a 12-μm copper foil (3EC-M3-VLP available from Mitsui Mining & Smelting Co., Ltd.) was disposed on both sides of the prepreg, a vacuum press was performed at a pressure of 30 kg/cm$^2$ and a temperature of 210° C. for 150 minutes, and 12-μm copper-clad laminates (metal foil-clad laminates) with thicknesses of 0.1 mm and 0.4 mm were obtained. Using the resulting copper-clad laminate (metal foil-clad laminate), dielectric constant and dielectric loss tangent, coefficient of linear thermal expansion (CTE), and uniformity of the cured product were evaluated. The results are shown in Table 1.

Example 2

A varnish was obtained by mixing 15 parts by mass of a maleimide compound (A) of Formula (2) in which all $R_4$'s are hydrogen atoms and $n_4$ is from 1 to 3 (BMI-2300 available from Daiwa Kasei Industry Co., Ltd.), 35 parts by mass of the SNCN (B) obtained from Synthesis Example 1, 10 parts by mass of a polyphenylene ether compound (C) of Formula (11) in which X is Formula (12) and —(Y—O)$n_2$- is formed by polymerization of a structural unit of Formula (15) (OPE-2St 1200 available from Mitsubishi Gas Chemical Company, Inc., number average molecular weight of 1187, vinyl group equivalent of 590 g/eq.), 10 parts by mass of a second polyphenylene ether compound (C) of Formula (11) in which X is Formula (12) and —(Y—O)$n_2$- is formed by polymerization of a structural unit of Formula (15) (OPE-2St 2200 available from Mitsubishi Gas Chemical Company, Inc., number average molecular weight of 2200, vinyl group equivalent of 1100 g/eq.), 10 parts by mass of a styrene-butadiene block copolymer (D) (TR2630 available from JSR Corporation, styrene ratio of 32%), 20 parts by mass of an α-methylstyrene polymer (E) (Ciystalex 3085 available from Eastman Chemical, number average molecular weight of 664), and 150 parts by mass of spherical silica (F) (SC2050-MB available from Admatechs Company Limited, average particle diameter of 0.5 μm), and diluting the solids with methyl ethyl ketone to 65 mass %. The subsequent processes were performed in the same manner as in Example 1, and metal-clad laminates with thicknesses of 0.1 mm and 0.4 mm were obtained. The evaluation results of the resulting metal-clad laminates are shown in Table 1.

Example 3

Metal-clad laminates with thicknesses of 0.1 mm and 0.4 mm were obtained in the same manner as in Example 2 except for using 15 parts by mass of a maleimide compound (A) of Formula (3) in which all $R_5$'s are hydrogen atoms and an average value of $n_5$ is 1.4 (MIR-3000 available from Nippon Kayaku Co., Ltd.) instead of using the maleimide compound (A) of Formula (2) in which all $R_4$'s are hydrogen atoms and $n_4$ is from 1 to 3. The evaluation results of the resulting metal-clad laminates are shown in Table 1.

Example 4

Metal-clad laminates with thicknesses of 0.1 mm and 0.4 mm were obtained in the same manner as in Example 2 except for using 15 parts by mass of a maleimide compound (A) of Formula (17) in which all $R_8$'s are methyl groups (BMI-80 available from K-I Chemical Industry Co., Ltd.) instead of using the maleimide compound (A) of Formula (2) in which all $R_4$'s are hydrogen atoms and $n_4$ is from 1 to 3. The evaluation results of the resulting metal-clad laminates are shown in Table 1.

Example 5

A varnish was obtained by mixing 12 parts by mass of a maleimide compound (A) of Formula (2) in which all $R_4$'s are hydrogen atoms and $n_4$ is from 1 to 3 (BMI-2300 available from Daiwa Kasei Industry Co., Ltd.), 28 parts by mass of the naphthol aralkyl cyanate ester SNCN (B) obtained from Synthesis Example 1, 10 parts by mass of a polyphenylene ether compound (C) of Formula (11) in which X is Formula (12) and —(Y—O)$n_2$- is formed by polymerization of a structural unit of Formula (15) (OPE-2St 1200 available from Mitsubishi Gas Chemical Company, Inc., number average molecular weight of 1187, vinyl group equivalent of 590 g/eq.), 10 parts by mass of a second polyphenylene ether compound (C) of Formula (11) in which X is Formula (12) and —(Y—O)$n_2$- is formed by polymerization of a structural unit of Formula (15) (OPE-2St 2200 available from Mitsubishi Gas Chemical Company, Inc., number average molecular weight of 2200, vinyl group equivalent of 1100 g/eq.), 10 parts by mass of a styrene-hydrogenated isoprene block copolymer (D) (SEPTON 2104 available from Kuraray Co., Ltd., styrene ratio of 65%), 20 parts by mass of an α-methylstyrene polymer (E) (Ciystalex 3085 available from Eastman Chemical, number average molecular weight of 664), 150 parts by mass of spherical silica (F) (SC2050-MB available from Admatechs Company Limited, average particle diameter of 0.5 μm), and 10 parts by mass of 1,3-phenylene bis(2,6-di-xylenylphosphate) (PX-200 available from Daihachi Chemical Industry Co., Ltd.) as a phosphorus-based flame retardant (G), and diluting the solids with methyl ethyl ketone to 65 mass %. The subsequent processes were performed in the same manner as in Example 1, and metal-clad laminates with thicknesses of 0.1 mm and 0.4 mm were obtained. The evaluation results of the resulting metal-clad laminates are shown in Table 1.

Comparative Example 1

A varnish was obtained by mixing 30 parts by mass of a maleimide compound (A) of Formula (2) in which all $R_4$'s are hydrogen atoms and $n_4$ is from 1 to 3 (BMI-2300 available from Daiwa Kasei Industry Co., Ltd.), 70 parts by mass of the naphthol aralkyl cyanate ester SNCN (B) obtained from Synthesis Example 1, and 150 parts by mass of spherical silica (F) (SC2050-MB available from Admatechs Company Limited, average particle diameter of 0.5 μm), and diluting the solids with methyl ethyl ketone to 65 mass %. The subsequent processes were performed in the same manner as in Example 1, and metal-clad laminates with thicknesses of 0.1 mm and 0.4 mm were obtained. The evaluation results of the resulting metal-clad laminates are shown in Table 2.

Comparative Example 2

Metal-clad laminates with thicknesses of 0.1 mm and 0.4 mm were obtained in the same manner as in Example 1 except for using 20 parts by mass of a polyphenylene ether compound (C) of Formula (11) in which X is Formula (12) and —(Y—O)$n_2$- is formed by polymerization of a structural unit of Formula (15) (OPE-2St 1200 available from Mitsubishi Gas Chemical Company, Inc., number average molecular weight of 1187, vinyl group equivalent of 590 g/eq.) without using 10 parts by mass of the styrene-butadiene block copolymer (D) (TR2630). The evaluation results of the resulting metal-clad laminates are shown in Table 2.

Comparative Example 3

A varnish was obtained by mixing 27 parts by mass of a maleimide compound (A) of Formula (2) in which all $R_4$'s are hydrogen atoms and $n_4$ is from 1 to 3 (BMI-2300 available from Daiwa Kasei Industry Co., Ltd.), 63 parts by mass of the naphthol aralkyl cyanate ester SNCN (B) obtained from Synthesis Example 1, 10 parts by mass of a styrene-butadiene block copolymer (D) (TR2630), and 150 parts by mass of spherical silica (F) (SC2050-MB available from Admatechs Company Limited, average particle diameter of 0.5 μm), and diluting the solids with methyl ethyl ketone to 65 mass %. The subsequent processes were performed in the same manner as in Example 1, and metal-clad laminates with thicknesses of 0.1 mm and 0.4 mm were obtained. The evaluation results of the resulting metal-clad laminates are shown in Table 2.

Comparative Example 4

A varnish was obtained by mixing 21 parts by mass of a maleimide compound (A) of Formula (2) in which all $R_4$'s are hydrogen atoms and $n_4$ is from 1 to 3 (BMI-2300 available from Daiwa Kasei Industry Co., Ltd.), 49 parts by mass of the naphthol aralkyl cyanate ester (B) obtained from Synthesis Example 1, 10 parts by mass of a styrene-butadiene block copolymer (D) (TR2630), 20 parts by mass of an α-methylstyrene polymer (E) (Crystalex 3085 available from Eastman Chemical, number average molecular weight of 664), and 150 parts by mass of spherical silica (F) (SC2050-MB available from Admatechs Company Limited, average particle diameter of 0.5 μm), and diluting the solids with methyl ethyl ketone to 65 mass %. The subsequent processes were performed in the same manner as in Example 1, and metal-clad laminates with thicknesses of 0.1 mm and 0.4 mm were obtained. The evaluation results of the resulting metal-clad laminates are shown in Table 2.

Comparative Example 5

Metal-clad laminates with thicknesses of 0.1 mm and 0.4 mm were obtained in the same manner as in Example 3 except for using 20 parts by mass of a polyphenylene ether compound (C) (SA9000 available from SABIC) not satisfying the structure of Formula (1) instead without using 10 parts by mass of the polyphenylene ether compound (C) of Formula (11) in which X is Formula (12) and —$(Y—O)n_2$- is formed by polymerization of a structural unit of Formula (15) (OPE-2St 1200) and 10 parts by mass of the second polyphenylene ether compound (C) of Formula (11) in which X is Formula (12) and —$(Y—O)n_2$- is formed by polymerization of a structural unit of Formula (15) (OPE-2St 2200). The evaluation results of the resulting metal-clad laminates are shown in Table 2.

Methods for Measurement and Evaluation
(1) Dielectric Constant (Dk) and Dielectric Loss Tangent (Df):
Using a sample prepared by removing the copper foil of the metal foil-clad laminate with a thickness of 0.4 mm obtained in each example and each comparative example by etching, dielectric constant and dielectric loss tangent at 10 GHz were measured with a perturbation cavity resonator (Agilent 8722ES, a product from Agilent Technologies Japan, Ltd.).
(2) Coefficient of Linear Thermal Expansion (CTE):
Using a sample prepared by removing the copper foil of the metal foil-clad laminate with a thickness of 0.1 mm obtained in each example and each comparative example by etching, coefficient of thermal expansion of the glass cloth in the vertical direction of the insulating layer of the laminate was measured by the thermo-mechanical analysis (TMA) method specified in JIS C 6481:1996, and its value was determined. Specifically, the copper foil on both sides of the metal foil-clad laminate obtained above was removed by etching, then a 4.5 mm×16 mm evaluation substrate was prepared, and coefficient of linear thermal expansion (CTE) (ppm/° C.) from 60° C. to 120° C. was measured by raising the temperature from 40° C. to 340° C. at 10° C. per minute with a thermal mechanical analyzer (available from TA Instruments).
(3) Uniformity of Cured Product (Poor Dispersion):
The cross section of the 0.4-mm thick metal-clad laminate obtained in each example and each comparative example was ground with a MetaServ 3000 available from BUEHLER, and the state of the cross section was observed using an EPIPHOT available from Nikon. Examples or comparative examples with void and poor dispersion observed are indicated as NG, and those without void and poor dispersion observed are indicated as OK, respectively.

INDUSTRIAL APPLICABILITY

As described above, the resin composition of the present invention can be widely and effectively utilized in various applications, such as electrical/electronic materials, machine tool materials, and aeronautical materials, for example, electrical insulating materials, semiconductor plastic packages, sealing materials, adhesives, laminate materials, resists, and build-up laminate board materials, and the resin composition of the present invention can be particularly effectively utilized, among others, as a printed wiring board material compatible for high integration and high density of information terminal devices, communication devices, and the like in recent years. In addition, the resin composition of the present invention forms uniform cured products, such as the laminate and the metal foil-clad laminate of the present invention that simultaneously achieve, in particular, excellent low dielectric constant properties, low dielectric loss tangent properties, and low thermal expansivity, thus having a remarkably high industrial practicality.

As is clear from Table 1 and Table 2, it was confirmed that the use of the resin composition of the present invention can

TABLE 1

|  |  | Example 1 | Example 2 | Example 3 | Example 4 | Example 5 |
|---|---|---|---|---|---|---|
| Dielectric constant |  | 3.5 | 3.4 | 3.3 | 3.4 | 3.4 |
| Dielectric loss tangent |  | 0.0029 | 0.0025 | 0.0027 | 0.0026 | 0.0025 |
| CTE | ppm/° C. | 7 | 7 | 7 | 7 | 7 |
| Cross-sectional state | Void | OK | OK | OK | OK | OK |
|  | Poor dispersion | OK | OK | OK | OK | OK |

TABLE 2

|  |  | Comparative Example 1 | Comparative Example 2 | Comparative Example 3 | Comparative Example 4 | Comparative Example 5 |
|---|---|---|---|---|---|---|
| Dielectric constant |  | 3.6 | 3.4 | 3.5 | 3.5 | 3.3 |
| Dielectric loss tangent |  | 0.0033 | 0.0032 | 0.0030 | 0.0027 | 0.0030 |
| CTE | ppm/° C. | 10 | 8 | 7 | 10 | 12 |
| Cross-sectional state | Void | OK | OK | OK | NG | NG |
|  | Poor dispersion | OK | OK | NG | NG | OK | form uniform cured products, such as a prepreg and a printed wiring board, that simultaneously achieve excellent low dielectric constant properties, low dielectric loss tangent properties, and low thermal expansivity.

The invention claimed is:

1. A resin composition comprising:
a maleimide compound (A),
a cyanate ester compound (B), and
a polyphenylene ether compound (C) with a number average molecular weight of not lower than 1000 and not higher than 7000,
a block copolymer (D) comprising a styrene backbone, and
a styrene oligomer (E),
wherein
the polyphenylene ether compound (C) is represented by Formula (1):

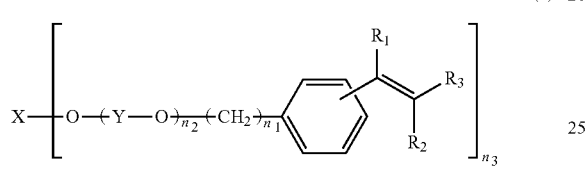

in Formula (1), X represents an aryl group; —(Y—O)$n_2$- represents a polyphenylene ether moiety; $R_1$, $R_2$, and $R_3$ each independently represent a hydrogen atom, an alkyl group, an alkenyl group, or an alkynyl group; $n_2$ represents an integer of from 1 to 100; $n_1$ represents an integer of from 1 to 6; and $n_3$ represents an integer of from 1 to 4,
a content of the polyphenylene ether compound (C) in the resin composition is not less than 5 parts by mass, and not more than 30 parts by mass, relative to 100 parts by mass of resin solid component of the resin composition,
the resin composition does not include phosphazene as a flame retardant, and
a total amount of a polyphenylene ether compound other than the polyphenylene ether compound (C) and an additional thermoplastic elastomer is not more than 3 mass %.

2. The resin composition according to claim 1, wherein the block copolymer (D) comprising a styrene backbone contains at least one selected from the group consisting of a styrene-butadiene block copolymer, a styrene-isoprene block copolymer, a styrene-hydrogenated butadiene block copolymer, a styrene-hydrogenated isoprene block copolymer, and a styrene-hydrogenated (isoprene/butadiene) block copolymer.

3. The resin composition according to claim 1, wherein the maleimide compound (A) contains at least one selected from the group consisting of Formulas (2), (3), (4), and (17):

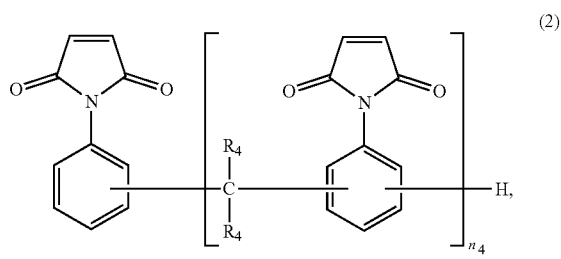

in Formula (2), $R_4$'s each independently represent a hydrogen atom or a methyl group; and $n_4$ represents an integer of not less than 1;

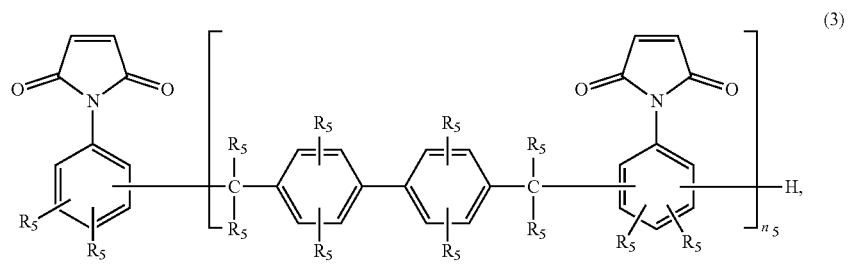

in Formula (3), $R_5$'s each independently represent a hydrogen atom, an alkyl group having from 1 to 8 carbon atoms, or a phenyl group; and $n_5$ represents an integer of not less than 1 and not more than 10;

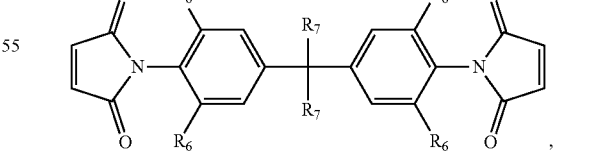

in Formula (4), $R_6$'s each independently represent a hydrogen atom, a methyl group, or an ethyl group; and $R_7$'s each independently represent a hydrogen atom or a methyl group; and

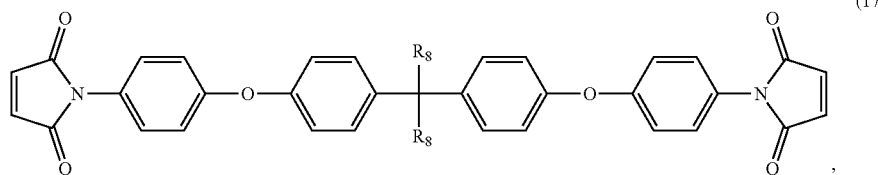

in Formula (17), $R_8$'s each independently represents a hydrogen atom, a methyl group, or an ethyl group.

4. The resin composition according to claim 1, further comprising a filler (F).

5. The resin composition according to claim 4, wherein a content of the filler (F) is from 50 to 300 parts by mass relative to 100 parts by mass of resin solid component.

6. The resin composition according to claim 1, further comprising a flame retardant (G).

7. The resin composition according to claim 1, wherein a content of the block copolymer (D) comprising a styrene backbone is from 1 to 50 parts by mass relative to 100 parts by mass of resin solid component.

8. The resin composition according to claim 1, wherein the polyphenylene ether compound (C) represented by Formula (1) is represented by Formula (11):

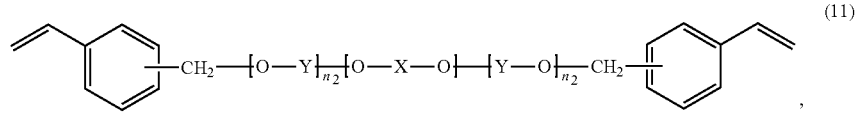

in Formula (11), X is an aromatic group selected from groups represented by Formula (12), Formula (13), and Formula (14); each $-(Y-O)_{n2}-$ represents a polyphenylene ether moiety; and each $n_2$ represents an integer of from 1 to 100:

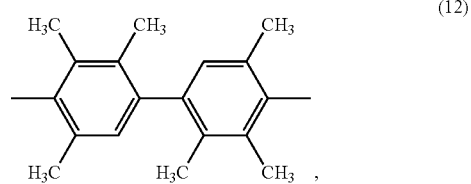

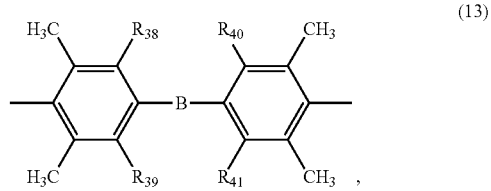

in Formula (13), $R_{38}$, $R_{39}$, $R_{40}$, and $R_{41}$ each independently represent a hydrogen atom or a methyl group; and $-B-$ is a linear, branched, or cyclic divalent hydrocarbon group having 20 or less carbon atoms; and

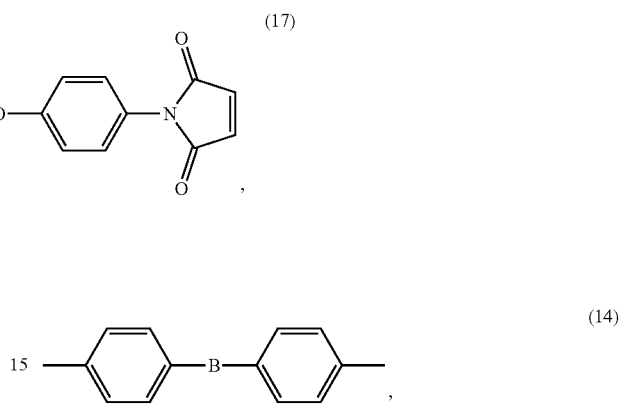

in Formula (14), $-B-$ is a linear, branched, or cyclic divalent hydrocarbon group having 20 or less carbon atoms.

9. The resin composition according to claim 1, wherein the content of the polyphenylene ether compound (C) in the resin composition is not less than 8 parts by mass and not more than 25 parts by mass, relative to 100 parts by mass of resin solid component of the resin composition.

10. The resin composition according to claim 1, wherein the block copolymer (D) comprising a styrene backbone contains no random copolymer.

11. The resin composition according to claim 1, wherein the styrene oligomer (E) comprises a styrene polymer, a vinyl toluene polymer, an α-methylstyrene polymer, a vinyltoluene-α-methylstyrene polymer, or a styrene-α-styrene polymer.

12. The resin composition according to claim 1, wherein the total amount of the polyphenylene ether compound other than the polyphenylene ether compound (C) and the additional thermoplastic elastomer is not more than 1 mass %.

13. The resin composition according to claim 1, wherein the content of the polyphenylene ether compound (C) in the resin composition is not less than 8 parts by mass, and not more than 25 parts by mass, relative to 100 parts by mass of resin solid component of the resin composition.

14. A prepreg formed from a substrate and a resin composition described in claim 1.

15. A metal foil-clad laminate comprising one or more layered prepregs described in claim 14, and a metal foil disposed on one side or both sides of the layered prepregs.

16. A resin sheet comprising a support and a layer disposed on a surface of the support, the layer being formed from a resin composition described in claim 1.

17. A printed wiring board comprising an insulating layer and a conductor layer disposed on a surface of the insulating layer, wherein the insulating layer comprises a layer formed from a resin composition described in claim 1.

* * * * *